US009282269B2

(12) United States Patent
Sato et al.

(10) Patent No.: US 9,282,269 B2
(45) Date of Patent: Mar. 8, 2016

(54) A/D CONVERSION DEVICE, SOLID-STATE IMAGE-CAPTURING DEVICE, AND ELECTRONIC DEVICE

(71) Applicant: Sony Corporation, Tokyo (JP)

(72) Inventors: Mamoru Sato, Kanagawa (JP); Yusuke Oike, Kanagawa (JP); Hiroyuki Iwaki, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/396,912

(22) PCT Filed: May 8, 2013

(86) PCT No.: PCT/JP2013/062903
§ 371 (c)(1),
(2) Date: Oct. 24, 2014

(87) PCT Pub. No.: WO2013/175959
PCT Pub. Date: Nov. 28, 2013

(65) Prior Publication Data
US 2015/0124137 A1 May 7, 2015

(30) Foreign Application Priority Data
May 21, 2012 (JP) ................................. 2012-115810

(51) Int. Cl.
H04N 5/374 (2011.01)
H04N 5/363 (2011.01)
(Continued)

(52) U.S. Cl.
CPC ............ *H04N 5/37455* (2013.01); *H03M 1/08* (2013.01); *H03M 1/0845* (2013.01);
(Continued)

(58) Field of Classification Search
CPC ... H04N 5/37455; H04N 5/363; H04N 5/365; H03M 1/08; H03M 1/0845; H03M 1/1245; H03M 1/42; H03M 1/182
USPC .......... 348/302, 294, 300, 241; 341/126, 155, 341/169, 170
See application file for complete search history.

(56) References Cited

U.S. PATENT DOCUMENTS 5,920,274 A * 7/1999 Gowda et al. ................. 341/155
2005/0057389 A1* 3/2005 Krymski ....................... 341/169
(Continued)

FOREIGN PATENT DOCUMENTS

JP 2005-175517 A 6/2005
JP 2006-222782 A 8/2006
(Continued)

OTHER PUBLICATIONS

International Search Report; International Application No. PCT/JP2013/062903; filed May 8, 2013. (Form PCT/ISA/210).
(Continued)

*Primary Examiner* — Nhan T Tran
(74) *Attorney, Agent, or Firm* — Michael Best & Friedrich LLP

(57) ABSTRACT

The present invention is to provide an A/D conversion device, a solid-state image-capturing device, and an electronic device capable of removing fixed pattern noise, capable of preventing an image from being corrupted, capable of generating an appropriate carry signal during bit shift, and capable of avoiding bit inconsistency even when the frequency of the carry signal increases due to the bit shift. A reading unit includes a comparator configured to compare the analog signal potential with a reference signal of which slope is variable, a counter latch unit capable of AD conversion based on processing according to the output of the comparator, and a bit shift function unit capable of bit-shifting the digital data obtained by the counter latch unit, and when digital Correlated Double Sampling (CDS) is performed with a first signal and a second signal having different bit precisions obtained from the comparison with reference signals of different slopes, the bit shift function unit bit-shifts the first signal or the second signal.

20 Claims, 27 Drawing Sheets

(51) Int. Cl.

| | | |
|---|---|---|
| *H03M 1/08* | (2006.01) | |
| *H04N 5/357* | (2011.01) | |
| *H03M 1/12* | (2006.01) | |
| *H04N 5/3745* | (2011.01) | |
| *H03M 1/42* | (2006.01) | |
| *H03M 1/18* | (2006.01) | |
| *H04N 5/378* | (2011.01) | |
| *H03M 1/56* | (2006.01) | |

(52) U.S. Cl.
CPC ............ *H03M1/1245* (2013.01); *H03M 1/182* (2013.01); *H03M 1/42* (2013.01); *H04N 5/3575* (2013.01); *H04N 5/363* (2013.01); *H04N 5/378* (2013.01); *H03M 1/123* (2013.01); *H03M 1/56* (2013.01)

(56) References Cited

U.S. PATENT DOCUMENTS

| | | |
|---|---|---|
| 2005/0168602 A1 | 8/2005 | Sumi et al. |
| 2008/0170137 A1* | 7/2008 | Matsumoto et al. .......... 348/241 |
| 2011/0025420 A1 | 2/2011 | Sumi et al. |
| 2011/0074994 A1* | 3/2011 | Wakabayashi et al. ....... 348/302 |
| 2011/0242385 A1 | 10/2011 | Nishihara |
| 2011/0304755 A1* | 12/2011 | Kondo .......................... 348/294 |
| 2012/0104235 A1 | 5/2012 | Sumi et al. |
| 2012/0327279 A1* | 12/2012 | Hashimoto et al. ........... 348/300 |
| 2013/0015329 A1* | 1/2013 | Iwaki ............................ 341/155 |
| 2013/0063627 A1* | 3/2013 | Hashimoto et al. ........... 348/241 |
| 2013/0089175 A1* | 4/2013 | Mo et al. ........................ 377/49 |

FOREIGN PATENT DOCUMENTS

| | | |
|---|---|---|
| JP | 2011-211535 A | 10/2011 |
| JP | 2011-234326 A | 11/2011 |
| JP | 2012-004727 A | 1/2012 |
| JP | 2013-009087 A | 1/2013 |
| JP | 2013-058930 A | 3/2013 |
| WO | WO-2009/131018 A1 | 10/2009 |

OTHER PUBLICATIONS

Written Opinion of the International Searching Authority; International Application No. PCT/JP2013/062903; Dated: Jul. 9, 2013. (Form PCT/ISA/220 and PCT/ISA/237).

* cited by examiner

A/D CONVERSION DEVICE, SOLID-STATE IMAGE-CAPTURING DEVICE, AND ELECTRONIC DEVICE

TECHNICAL FIELD

The present invention relates to an A/D conversion device, a solid-state image-capturing device, and an electronic device which can be applied to a solid-state image-capturing device such as a CMOS image sensor.

BACKGROUND ARTS

In recent years, CMOS image sensors are widely used for the purposes such as a digital still camera, a camcorder, and a surveillance camera, and the market of CMOS image sensors is expanding.

A CMOS image sensor converts light incident upon each pixel into electron using a photodiode which is a photoelectric conversion device, and accumulates the electron for a certain period of time, and the CMOS image sensor converts a signal reflecting the amount of accumulated electrical charge into digital and outputs the signal.

In general, a pixel circuit of the CMOS image sensor uses a source follower incorporated into the pixel circuit to convert an electrical charge signal given by the photodiode into a potential signal of an output (vertical) signal line and output the signal.

During reading, selection of pixels is executed in order in units of rows, and the pixel signals of columns in the selected row are converted from analog into digital (A/D) in order or in parallel, and the signals are output as captured image data.

In particular, in recent years, an A/D conversion device is provided for each column in order to increase the speed and the conversion is performed at a time in many cases.

The A/D conversion of the CMOS image sensor widely uses a slope A/D conversion device in which a comparator compares an image signal with a ramp wave serving as a reference signal (reference voltage), and a counter performs time integration until the output of the comparator is inverted.

The slope A/D conversion device has superior linearity and noise characteristics.

A column A/D conversion device including multiple A/D conversion devices arranged for corresponding pixel columns and performing A/D conversion at a time can improve the speed because the operating frequency per A/D conversion device is reduced. In addition, the reference voltage generation device is shared by the A/D conversion devices, and therefore, the footprint and the power consumption efficiency are advantageous, and the compatibility with CMOS image sensors is better as compared with other A/D conversion methods.

Patent Document 1 discloses the following technique.

In this technique, multiple reference voltage generation devices are provided to generate different ramp wave inclinations for a single comparator, and captured images are obtained such that data are obtained with a high bit precision in a dark place, and data are obtained with a low bit precision in a bright place, whereby an image with a high dynamic range is obtained.

This technique makes use of the feature of image sensing that a fine level of gradation is required only in a dark place.

On the other hand, Patent Documents 2, 3 disclose the following technique.

In this technique, in a column A/D conversion device, gray code counters and latches provided for multiple corresponding columns obtain lower bits, and binary ripple counters provided for multiple corresponding columns obtain higher bits, so that the power consumption is greatly reduced.

In this technique, in the higher bit, digital CDS (Correlated Double Sampling) is achieved by up/down counting performed by a ripple counter according to conventional techniques.

Since the lower bit is a gray code, black level and image data are stored to the latches, and the data are transferred to a digital processor and the like, in which the data are converted into binary codes, and are subjected to digital CDS.

CITATION LIST

Patent Document

Patent Document 1: JP 2011-211535 A
Patent Document 2: JP 2011-234326 A
Patent Document 3: JP 2011-250395 A

SUMMARY OF THE INVENTION

Problems to be Solved by the Invention

However, the techniques disclosed in Patent Documents 1, 2, 3 have the following disadvantages.

In the technique disclosed in Patent Document 1, the black level and the image data are read twice with the high bit precision and the low bit precision, and therefore, the frame rate of image-capturing is sacrificed.

In the reading of the low bit precision, the black level is read later, and therefore, fixed pattern noise cannot be completely eliminated.

If the CDS is applied to the image data of the low bit precision using the black level obtained with the high bit precision, the fixed pattern noise can be eliminated, and this eliminates the necessity of the period of time for reading the black level with low bit precision, and therefore, the frame rate can be increased.

However, when the bit precisions for the black level and the image data are different, the analog voltage values per LSB are different, and therefore, when the generally-available counter digital CDS based on up/down counting, image data are corrupted.

In the technique disclosed in Patent Document 2, the lower bits are configured for the gray code counter, and the higher bits are configured for the binary ripple counter, and a signal in synchronization with the timing of the gray code counter is sent to the ripple counter as a carry.

When the bit precisions of the black level and the image data are different, and the counter CDS is applied, it is necessary to generate a carry signal bit shifted so that the bit weights of the higher bits (voltage values) are the same.

Patent Document 2 recites that "including a higher bit counter for counting data in the lower bit latch unit as a carry", but the data in the lower bit latch unit is not an appropriate carry signal during bit shift.

In the technique disclosed in Patent Document 3, a carry mask signal is generated from the latch unit of the gray code counter and the carry signal is masked in order to avoid bit inconsistency.

However, when the frequency of the carry signal increases because of bit shift, the mask period is insufficient, and this may result in inability to avoid bit inconsistency.

The present invention is to provide an A/D conversion device, a solid-state image-capturing device, and an electronic device capable of removing fixed pattern noise, capable of preventing an image from being corrupted, capable of generating an appropriate carry signal during bit shift, and capable of avoiding bit inconsistency even when the frequency of the carry signal increases due to the bit shift.

Solutions to Problems

An A/D conversion device according to a first aspect of the present invention includes a reading unit having an analog digital (A/D) conversion unit configured to compare a level of a input analog signal with a reference signal that displaces with a configured slope and making the output signal into digital data on the basis of a period when the output signal and the reference signal attain a predetermined relationship, wherein the reading unit includes a comparator configured to compare the analog signal potential of a signal line with a reference signal of which slope is variable, a counter latch unit capable of AD conversion based on processing according to the output of the comparator, and a bit shift function unit capable of bit-shifting the digital data obtained by the counter latch unit, and wherein when digital Correlated Double Sampling (CDS) is performed with a first signal and a second signal having different bit precisions obtained from the comparison with reference signals of different slopes, the bit shift function unit bit-shifts the first signal or the second signal.

A solid-state image-capturing device according to a second aspect of the present invention includes a photoelectric conversion device, a pixel circuit configured to output, to a signal line, an analog signal corresponding to electrical charge photoelectrically converted by the photoelectric conversion device and a reading unit having an analog digital (A/D) conversion unit configured to compare an output level of the signal line with a reference signal that displaces with a configured slope and making the output signal into digital data on the basis of a period when the output signal and the reference signal attain a predetermined relationship, wherein the reading unit includes a comparator configured to compare the analog signal potential of the signal line with the reference signal of which slope is variable, a counter latch unit capable of AD conversion based on processing according to the output of the comparator, and a bit shift function unit capable of bit-shifting the digital data obtained by the counter latch unit, and wherein when digital Correlated Double Sampling (CDS) is performed with a first signal and a second signal which are read from the pixel circuit and having different bit precisions obtained from the comparison with reference signals of different slopes, the bit shift function unit bit-shifts the first signal or the second signal.

An electronic device according to a third aspect of the present invention includes a solid-state image-capturing device, wherein the solid-state image-capturing device includes a photoelectric conversion device, a pixel circuit configured to output, to a signal line, an analog signal corresponding to electrical charge photoelectrically converted by the photoelectric conversion device, and a reading unit having an analog digital (A/D) conversion unit configured to compare an output level of the signal line with a reference signal that displaces with a configured slope and making the output signal into digital data on the basis of a period when the output signal and the reference signal attain a predetermined relationship, wherein the reading unit includes a comparator configured to compare the analog signal potential of the signal line with the reference signal of which slope is variable, a counter latch unit capable of AD conversion based on processing according to the output of the comparator, and a bit shift function unit capable of bit-shifting the digital data obtained by the counter latch unit, and wherein when digital Correlated Double Sampling (CDS) is performed with a first signal and a second signal which are read from the pixel circuit and having different bit precisions obtained from the comparison with reference signals of different slopes, the bit shift function unit bit-shifts the first signal or the second signal.

Effects of the Invention

According to the present invention, fixed pattern noise can be removed, an image can be prevented from being corrupted, an appropriate carry signal can be generated during bit shift, and bit inconsistency can be avoided even when the frequency of the carry signal increases due to the bit shift.

MODE FOR CARRYING OUT THE INVENTION

Figure 1:
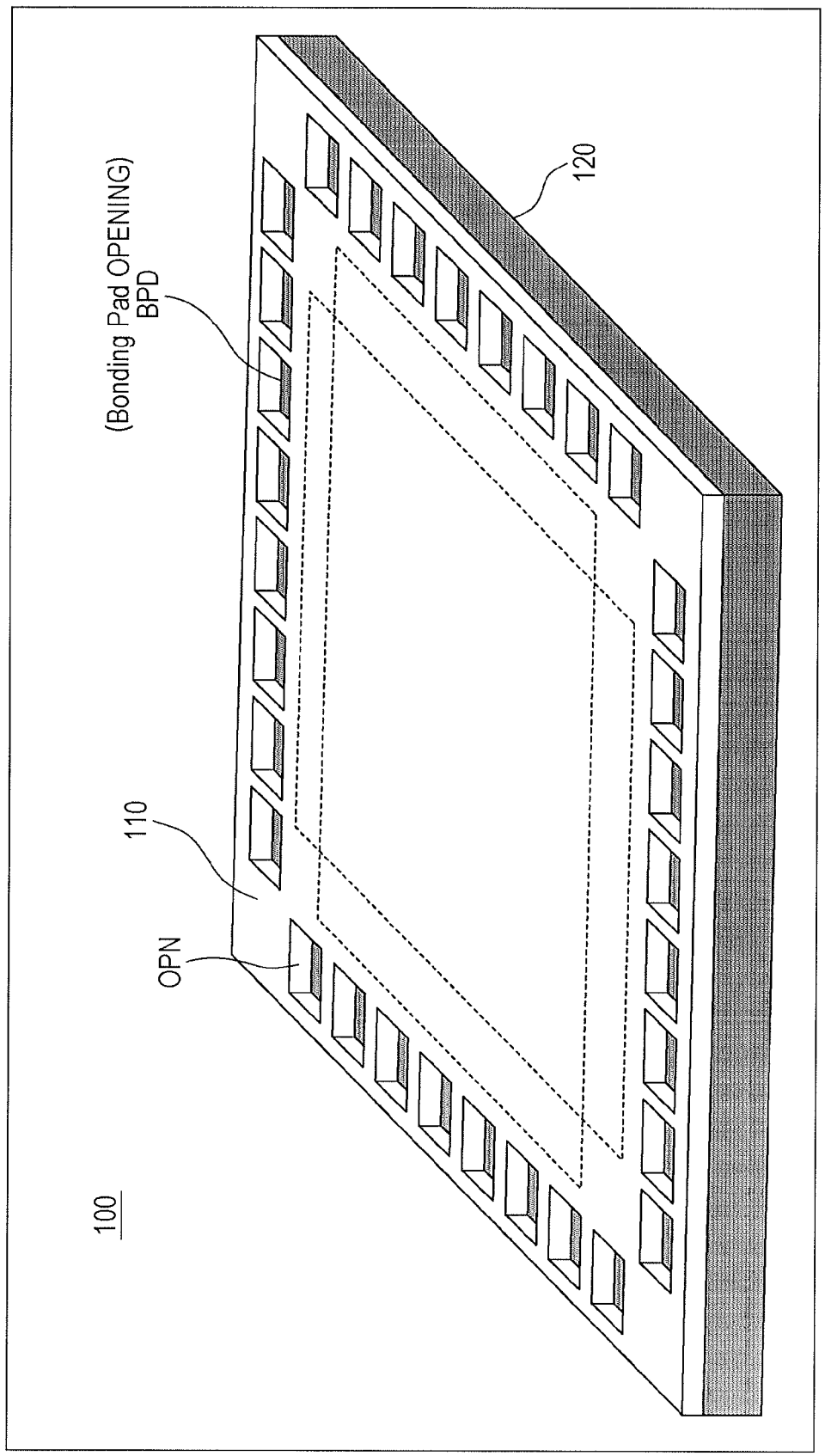
FIG. 1 is a figure illustrating an example of a stacking structure of a semiconductor device according to an embodiment of the present technique.

Hereinafter, an embodiment of the present technique will be explained in association with drawings.

It should be noted that the explanation will be made in the following order.

1. Overview of semiconductor device
1.1 First arrangement configuration example of semiconductor device
1.2 Second arrangement configuration example of semiconductor device
1.3 Third arrangement configuration example of semiconductor device
2. Overview of solid-state image-capturing device
2.1 Basic configuration example of solid-state image-capturing device
2.2 Entire configuration example of solid-state image-capturing device having column parallel ADC
2.3 Basic configuration example of first column ADC
2.4 First realization example of counter and bit shift system
2.5 Second realization example of counter and bit shift system
2.6 Basic configuration example of second column ADC
2.7 Configuration example of gray code counter
2.8 First configuration example of column processing unit
2.9 Second configuration example of column processing unit
2.10 Third configuration example of column processing unit
2.11 Fourth configuration example of column processing unit
2.12 Fifth configuration example of column processing unit
2.13 Sixth configuration example of column processing unit
3. Configuration example of electronic device <1. Overview of Semiconductor Device>

FIG. 1 is a figure illustrating an example of a stacking structure of a semiconductor device according to the present embodiment.

A semiconductor device 100 according to the present embodiment includes multiple sensors including photoelectric conversion devices and the like arranged in an array form.

Hereinafter, a configuration example of a semiconductor device having such configuration will be explained, and thereafter, a configuration example of a CMOS image sensor which is a solid-state image-capturing device will be explained as an example of a semiconductor device.

Then, a specific configuration example of a slope AD conversion device which can be applied to a solid-state image-capturing device will be explained in details.

This slope A/D conversion device can remove fixed pattern noise, prevent an image from corrupting, generate an appropriate carry signal during bit shift, and avoid bit inconsistency even when the frequency of the carry signal increases due to bit shift.

As shown in FIG. 1, the semiconductor device 100 has a stacking structure including a first chip (upper chip) 110 and a second chip (lower chip) 120.

The first chip 110 and the second chip 120 which are stacked are electrically connected by vias (TC(S)V (Through Contact (Silicon) VIAs)) formed in the first chip 110.

This semiconductor device 100 is formed as a semiconductor device having the stacking structure which is made by pasting process in wafer level and cutting by dicing.

In the stacking structure including the upper lower two chips, the first chip 110 is constituted by an analog chip (sensor chip) having multiple sensors arranged in an array form.

The second chip 120 is constituted by a logic chip (digital chip) including a circuit and signal processing circuit quantizing an analog signal transferred by way of the TCVs from the first chip 110.

The bonding pads BPD and the input/output circuit are formed on the second chip 120. Opening portions OPN for wire bonding the second chip 120 are formed on the first chip 110.

The semiconductor device 100 having the stacking structure including the two chips according to the present embodiment has the following distinctive configuration.

An electrical connection between the first chip 110 and the second chip 120 is, for example, made by way of the vias (TCVs).

The positions where the TCVs (vias) are arranged are considered to be between the end of the chip or the pad and the circuit area.

For example, control signal and electric power supply TCV are mainly concentrated at four chip corner portions, and the signal wiring area of the first chip 110 can be reduced.

The number of wiring layers of the first chip 110 is reduced, so that the power source line resistance is increased, and by effectively arranging the TCV in order to solve the problem of the increase of IR-Drop, countermeasure for noise of the power source of the first chip 110 and strengthening for stable supply and the like can be achieved using the wiring of the second chip 120.

<1.1 First Arrangement Configuration Example in Semiconductor Device>

Figure 2:
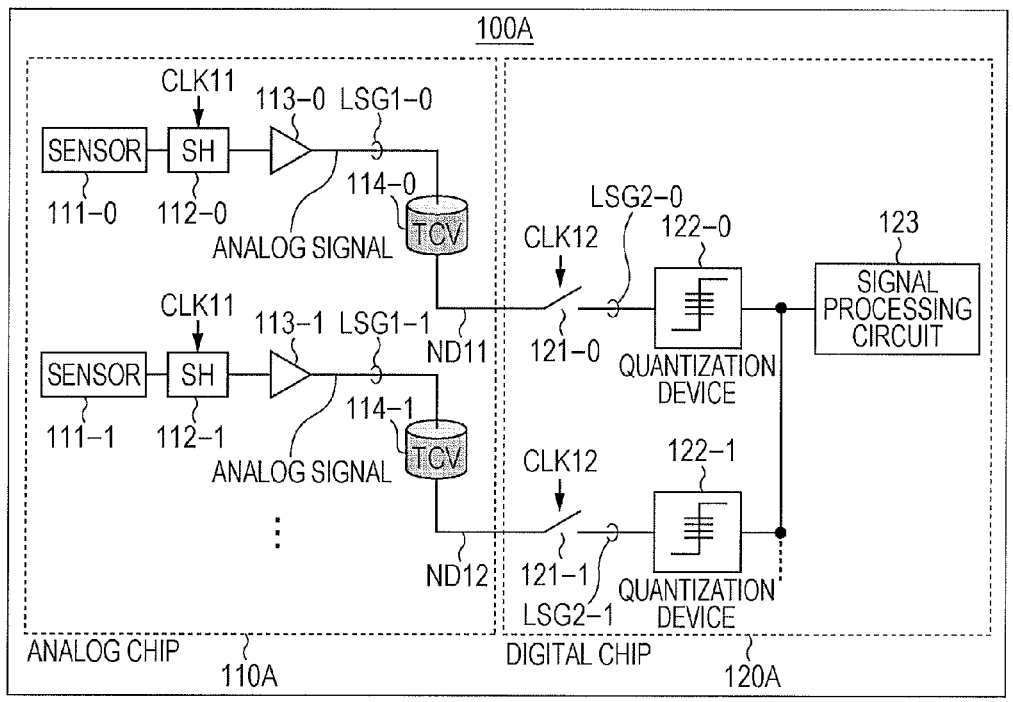
FIG. 2 is a figure illustrating a first arrangement configuration example of a circuit and the like in the semiconductor device according to the present embodiment.

FIG. 2 is a figure illustrating a first arrangement configuration example of a circuit and the like in the semiconductor device according to the present embodiment.

The semiconductor device 100A of FIG. 2 is shown in such a manner that the first chip 110A and the second chip 120A are expanded in a two-dimensional manner so as to allow for easy understanding of the arrangement of the circuit and the like of the first chip 110A and the second chip 120A having the stacking structure.

The first chip 110A is formed with multiple sensors 111 (–0, –1, . . . ) arranged in an array form and first signal lines LSG1 (–0, –1, . . . ) for transmitting output analog signals (sensor signals) of the sensors 111 (–0, –1, . . . ).

In the first chip 110A, the first signal lines LSG1 (–0, –1, . . . ) are arranged with sample and hold (SH) circuits 112 (–0, –1, . . . ) for sampling the sensor signals of the sensors 111 (–0, –1, . . . ) with a first clock CLK11.

The first signal lines LSG1 (–0, –1, . . . ) are arranged with amplification devices (amplifiers) 113 (–0, –1, . . . ) for amplifying the output sensor signals of the sample and hold (SH) circuits 112 (–0, –1, . . . ), respectively.

The first chip 110A is formed with TCVs 114 (–0, –1, . . . ) electrically connecting the first signal lines LSG1 (–0, –1, . . . ) with the second chip 120A and for transmitting the sensor signals.

Although not shown, the first chip 110A is formed with TCVs for the power source and the control signals.

The second chip 120A is formed with second signal lines LSG2 (–0, –1, . . . ) connected with the TCVs 114 formed in the first chip 110A.

The second signal lines LSG2 (–0, –1, . . . ) are arranged with the sampling switches 121 (–0, –1, . . . ) sampling the sensor signals transmitted through the TCVs 114 with a second clock CLK12.

The second signal line LSG2s (–0, –1, . . . ) are arranged with quantization devices 122 (–0, –1, . . . ) quantizing the signals sampled by the sampling switches 121 (–0, –1, . . . ).

The second chip 120A is arranged with a signal processing circuit 123 which performs digital arithmetic processing on the signals quantized by the quantization devices 122 (–0, –1, . . . ).

In the semiconductor device 100A, the signals which are output from the sensors 111 are sampled and held by the SH circuit 112, and are transmitted via the amplifiers 113 to the TCVs 114.

In this case, when the electric power of a signal which is output from the SH circuit 112 from the sensor 111 is sufficiently high, the amplifier may not be provided.

The signal transmitted via the TCV 114 is sampled by the sampling switch 121 on the second chip 120A which is a logic chip (digital chip), and is quantized in the voltage direction using the quantization device 122. The data thus made into digital are arithmetically processed by the signal processing circuit 123.

In the present technique, the signal transmitted through the TCV 114 is discretized in the time direction, and is a signal continuous in the voltage direction, which is a discrete time analog signal.

In this case, signal interference from an adjacent TCV 114 occurs.

However, interference between TCVs can be avoided by appropriately controlling timing of the first clock CLK11 for controlling timing with which the SH circuit 112 performs sample and hold and the second clock CLK12 with which the discrete time analog signal is sampled on the second chip 120A.

FIGS. 3(A) to (C) are figures illustrating relationship of signals in terms of time in the semiconductor device according to the present embodiment.

FIG. 3(A) illustrates a signal waveform at a node ND11 where a signal transmitted through the TCV is supplied. FIG. 3(B) illustrates the first clock CLK11. FIG. 3(C) illustrates the second clock CLK12.

Now, the node ND11 of the discrete time analog signal transmitted through the TCV 114 is considered.

The first clock CLK11 uses the same timing for all the SH circuit 112 connected to the sensors 111, and therefore, the time of the signal transition of a node ND12 adjacent to the node ND11 is synchronized in an ideal case.

However, for example, when the signal output timings from the sensors to the node ND11 and the node ND12 are delayed because of wiring delay of the signals, a pulse caused by interference to the signal of the node ND11 occurs as shown in FIG. 3(A).

However, in a section for transmitting a piece of data, the signal is already discretized in term of time by the SH circuit 112, and therefore, a constant value is obtained in this section, and after a sufficient period of time passes, it is stabilized at a desired value.

The SH circuit 112 is driven so as to perform sampling using the second clock CLK12 at the point in time when the value is sufficiently stabilized, so that the error caused by the interference of the TCV 114 can be reduced to a level that can be almost disregarded.

<1.2 Second Arrangement Configuration Example in Semiconductor Device>

Figure 4:
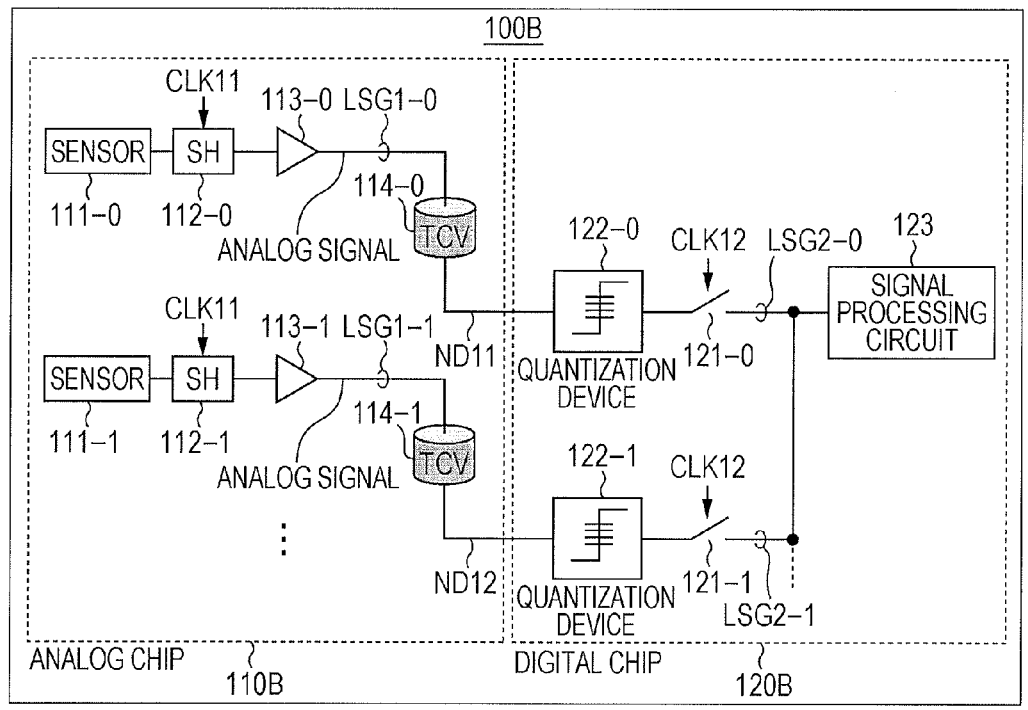
FIG. 4 is a figure illustrating a second arrangement configuration example of a circuit and the like in the semiconductor device according to the present embodiment.

FIG. 4 is a figure illustrating a second arrangement configuration example of a circuit and the like in the semiconductor device according to the present embodiment.

A semiconductor device 100B of FIG. 4 is different from the semiconductor device 100A of FIG. 2 with regard to the following features.

More specifically, in the second chip 120B, the arrangement positions (connection positions) of the sampling switches 121 (–0, –1, . . . ) and the quantization devices 122 (–0, –1, . . . ) in the second signal lines LSG2 (–0, –1, . . . ) are opposite.

The order of sampling and quantization at the time of the second clock CLK12 according to the present technique may be changed to the following order: quantization in continuous time and then the sampling switch 121 connected to the quantization device 122.

In this case, operation of the sampling switch 121 is achieved by providing a flip flop for each signal When the configuration as shown in FIG. 2 is employed, kT/C noise is generated when the sampling switch 121 is in the OFF state (open state), which may cause problem, but kT/C noise is not generated in the configuration of FIG. 4.

<1.3 Third Arrangement Configuration Example of Semiconductor Device>

Figure 5:
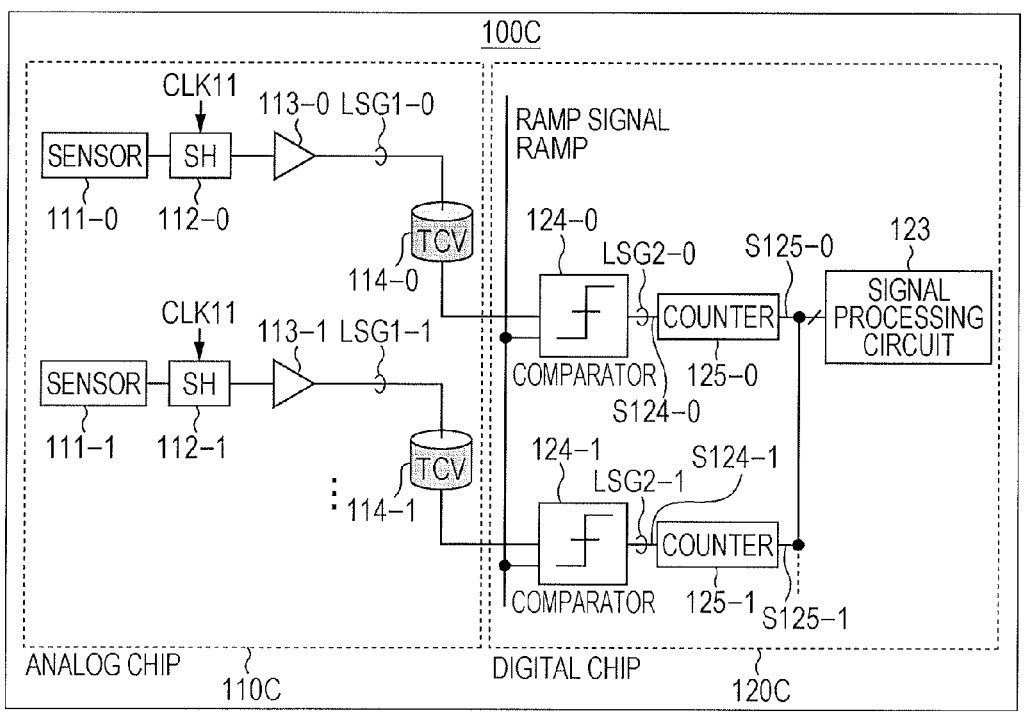
FIG. 5 is a figure illustrating a third arrangement configuration example of a circuit and the like in the semiconductor device according to the present embodiment.

FIG. 5 is a figure illustrating a third arrangement configuration example illustrating a circuit and the like in the semiconductor device according to the present embodiment.

A semiconductor device 100C of FIG. 5 is different from the semiconductor devices 100A, 100B of FIG. 2 and FIG. 4 with regard to the following features.

More specifically, instead of the sampling switch and the quantization device, a second chip 120C is provided with comparators 124 (-0, -1, . . . ) and counters 125 (-0, -1, . . . ).

In this second chip 120C, the comparator 124 compares the ramp signal RAMP and the sensor signal transmitted through the TCV 114, and it is converted from the voltage axis into the time axis, and the time information is quantized by the counter 125.

Figure 3:
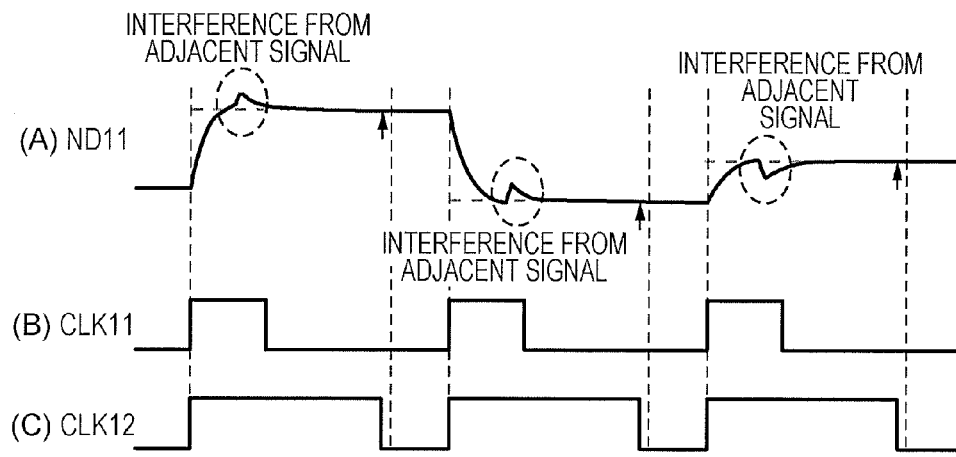
FIGS. 3(A) to 3(C) are figures illustrating relationship of signals in terms of time in the semiconductor device according to the present embodiment.
Figure 6:
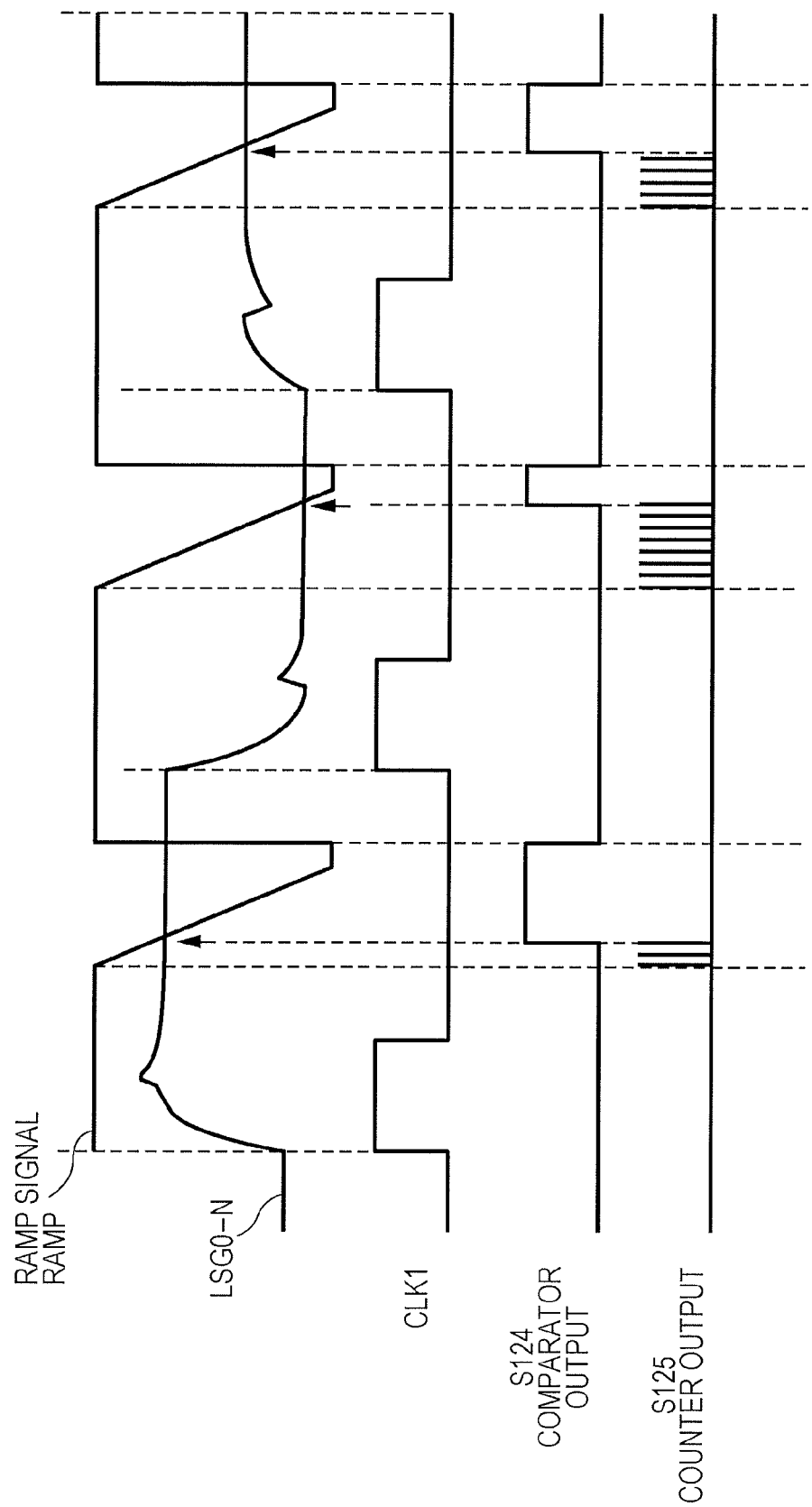
FIG. 6 is a figure showing that interference from an adjacent column can be reduced by causing the semiconductor device of FIG. 5 to operate according to a waveform in a time axis.

FIG. 6 shows that the interference from an adjacent column can be reduced in this case according to the same principle as FIG. 3. In the configuration of FIG. 5, the AD conversion operation is performed by comparing the ramp wave RAMP and the signal, and causing the counter 125 to convert the time into a digital value. Therefore, the AD conversion device does not retrieve the signal in a time when the ramp wave and the counter 125 do not operate.

In this case, as shown in FIG. 6, the transition of the ramp wave and the operation of the counter are started after the signal output LSG0-N is sufficiently stabilized, so that the error caused by the interference of an adjacent TCV can be reduced like FIG. 3.

<2. Overview of Solid-State Image-Capturing Device>

A configuration example of a CMOS image sensor which is a solid-state image-capturing device will be explained as an example of semiconductor device according to the present embodiment.

<2.1 Basic Configuration of Solid-State Image-Capturing Device>

Figure 7:
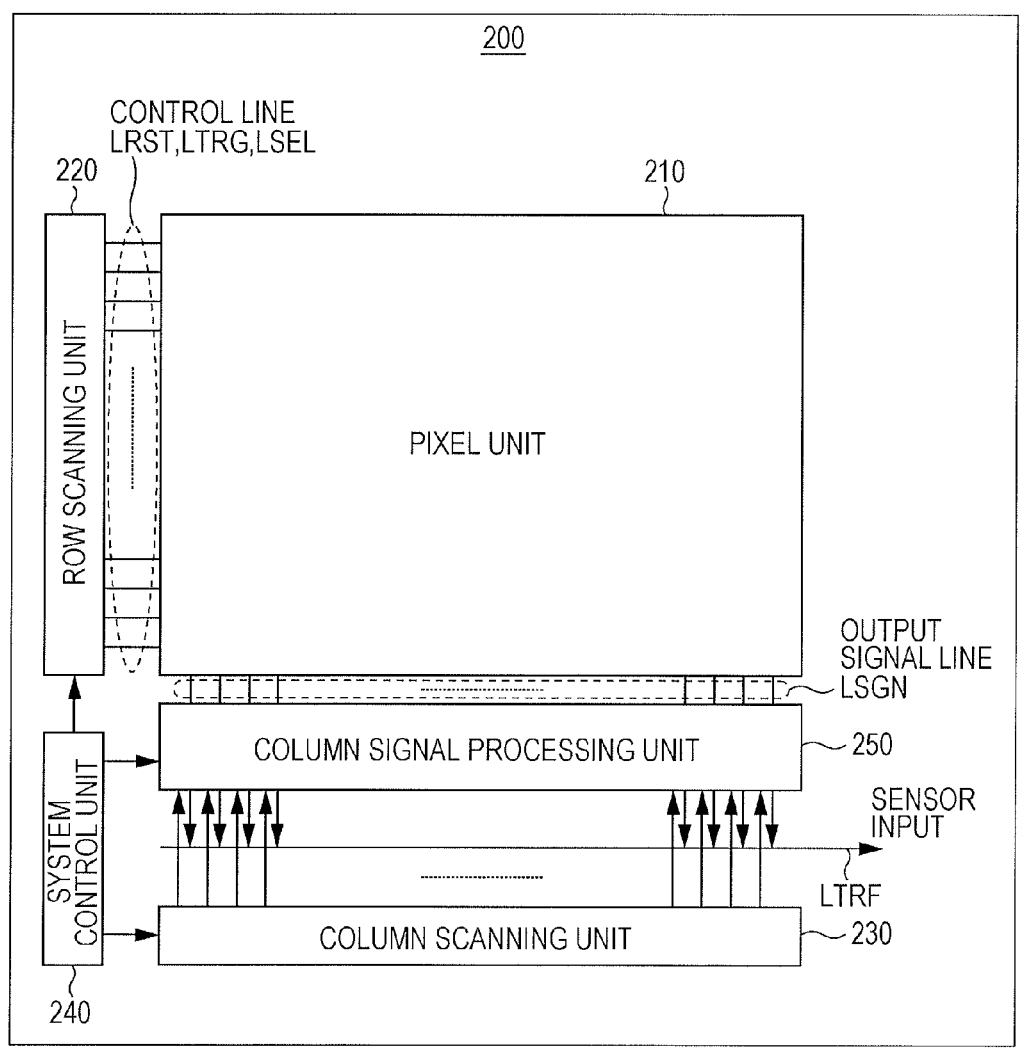
FIG. 7 is a figure illustrating a basic configuration example of a solid-state image-capturing device (CMOS image sensor) according to the present embodiment.

FIG. 7 is a figure illustrating a basic configuration example of a solid-state image-capturing device (CMOS image sensor) according to the present embodiment.

A CMOS image sensor 200 of FIG. 7 includes a pixel unit 210, a row scanning unit 220, a column scanning unit 230, a system control unit 240, and a column (column) signal processing unit 250.

Then, a pixel signal reading unit is constituted by the row scanning unit 220, the column scanning unit 230, and the column signal processing unit 250.

The stacking structure of FIG. 1 is employed as the CMOS image sensor 200 serving as the semiconductor device.

In the present embodiment, the stacking structure is basically configured such that the pixel unit 210 is arranged on the first chip 110, and the row scanning unit 220, the column scanning unit 230, the system control unit 240, and the column signal processing unit 250 are arranged on the second chip 120.

The driving signals of the pixels and the analog read signals of the pixels (sensors), the power source voltage, and the like are exchanged between the first chip 110 and the second chip 120 through the TCVs formed in the first chip 110.

The pixel unit 210 has pixel circuits (pixels) 210A serving as multiple unit circuits which are arranged in M rows by N columns two-dimensional form (matrix form).

Figure 8:
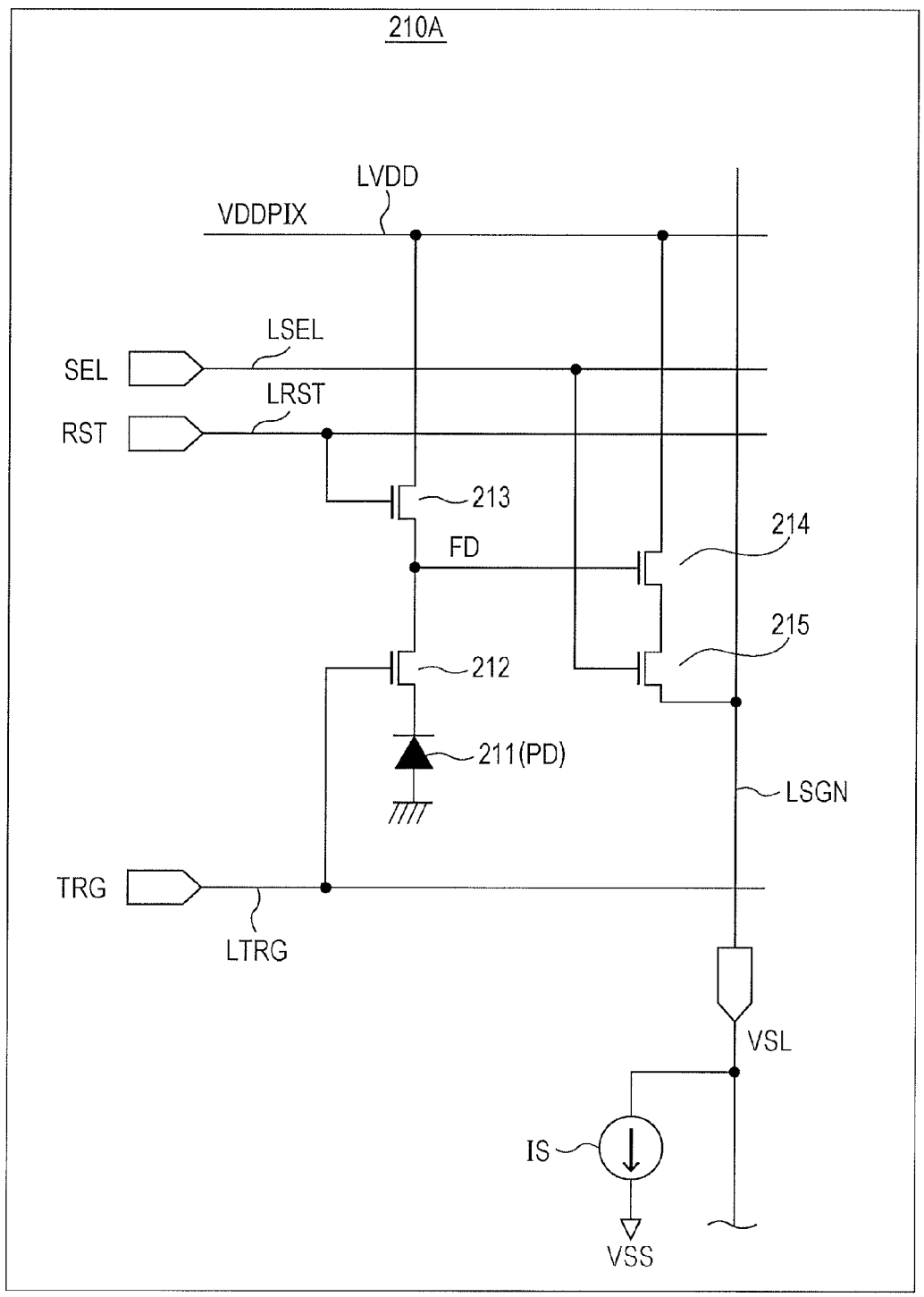
FIG. 8 is a figure illustrating an example of a pixel of the CMOS image sensor constituted by four transistors according to the present embodiment.

FIG. 8 is a figure illustrating an example of a pixel of a CMOS image sensor constituted by four transistors according to the present embodiment.

This pixel circuit 210A has a photoelectric conversion device (which may be hereinafter simply referred to as a PD) 211 made of, for example, a photodiode (PD).

For a single photoelectric conversion device 211, the pixel circuit 210A has four transistors, which are active devices, including a transfer transistor 212, a reset transistor 213, an amplification transistor 214, and a selection transistor 215.

The photoelectric conversion device 211 photoelectrically converts the incident light into an amount of electrical charge (electrons in this case) corresponding to the amount of light.

The transfer transistor 212 serving as a transfer device is connected between the photoelectric conversion device 211 and a floating diffusion FD serving as an input node. A transfer signal TRG which is a control signal is given to the gate (transfer gate) of the transfer transistor 212 via a transfer control line LTRG.

Therefore, the transfer transistor 212 transfers the electrons, which are obtained from the photoelectrical conversion performed by the photoelectric conversion device 211, to the floating diffusion FD.

The reset transistor 213 is connected between the floating diffusion FD and a power source line LVDD to which a power source voltage VDD is provided. A reset signal RST which is a control signal is given to the gate of the reset transistor 213 via the reset control line LRST.

Therefore, the reset transistor 213 serving as the reset device resets the potential of the floating diffusion FD to the potential of the power source line LVDD.

The floating diffusion FD is connected to the gate of the amplification transistor 214 serving as an amplification device. More specifically, the floating diffusion FD functions as an input node for the amplification transistor 214 serving as the amplification device.

The amplification transistor 214 and the selection transistor 215 are connected in series between the signal line LSGN and the power source line LVDD to which the power source voltage VDD is supplied.

As described above, the amplification transistor 214 is connected via the selection transistor 215 to the signal line LSGN, and the amplification transistor 214 and a constant electric current source IS, provided outside of the pixel unit, constitute a source follower.

A selection signal SEL which is a control signal according to an address signal is given via a selection control line LSEL to the gate of the selection transistor 215, and accordingly the selection transistor 215 is turned on.

When the selection transistor 215 is turned on, the amplification transistor 214 amplifies the potential of the floating diffusion FD, and outputs a voltage according to the potential to the signal line LSGN. The voltage which is output from each pixel through the signal line LSGN is output to the column signal processing unit 250.

For example, the gates of the transfer transistor 212, the reset transistor 213, and the selection transistor 215 are connected in units of rows, and therefore, the above operation is done at a time for each of the pixels in a single row.

The reset control line LRST, the transfer control line LTRG, and the selection control line LSEL wired to the pixel unit 210 make a set and are wired in unit of each row of the pixel arrangement.

M control lines are provided for each of LRST, LTRG, and LSEL.

The reset control line LRST, the transfer control line LTRG, and the selection control line LSEL are driven by the row scanning unit 220.

The pixel unit 210 having such configuration is formed on the first chip 110 including the signal wiring and the control wiring as described above.

In the present embodiment, the constant electric current source IS, which forms the source follower together with the amplification transistor 214 arranged on the first chip 110, is arranged on the second chip 120.

It should be noted that the configuration of the pixel circuit is not limited to the configuration of FIG. 8. Various kinds of configurations such as a transistor type and an FD shared type can be applied thereto.

The row scanning unit 220 controls operation of the pixels arranged in any given row of the pixel unit 210 under the control of the system control unit 240. The row scanning unit 220 controls pixels through the control lines LSEL, LRST, LTRG.

In accordance with, for example, a shutter mode switch signal, the row scanning unit 220 switches the exposure method to either a rolling shutter mode method for exposing each row or a global shutter mode method for exposing the pixels, and performs image driving control.

Under the control unit of the system control unit 240, the column scanning unit 230 and the column signal processing unit 250 receive, via the signal line LSGN, data of a pixel row which is reading-controlled by the row scanning unit 220, and transfer the data to a signal processing circuit in a subsequent stage.

The column signal processing unit 250 includes a CDS circuit and an ADC (analog digital converter).

[Configuration Example of Solid-State Image-Capturing Device Having Column Parallel ADC]

It should be noted that a solid-state image-capturing device (CMOS image sensor) according to the present embodiment is not particularly limited, and can be configured as a solid-state image-capturing device having, for example, column parallel-type analog-digital conversion device (which may be hereinafter abbreviated as an ADC).

Hereinafter, a configuration example of a solid-state image-capturing device (CMOS image) having a column parallel-type ADC will be explained.

In this case, first, the configuration example of the entire solid-state image-capturing device having column parallel ADC will be explained. Thereafter, the first solid-state image-capturing device (CMOS image sensor) including the first column ADC in which counters of all bit binary codes are arranged in an array form will be explained.

Thereafter, the second solid-state image-capturing device (CMOS image sensor) including the second column ADC in which composite counters for lower bit gray code and higher bit binary code are arranged in an array form will be explained.

In the present embodiment, the first and second ADCs in which multiple counters are arranged in an array form have the following distinctive configuration.

Basically, the solid-state image-capturing device has a reference signal (voltage) generation unit generating different ramp wave inclinations for a single comparator, and obtains captured images so as to obtain data with a high bit precision in a dark place, and data with a low bit precision in a bright place, thus obtaining an image with a high dynamic range.

More specifically, the first and second solid-state image-capturing devices (CMOS image sensors) have the function for carrying out CDS in normal reading, and in addition, the first and second solid-state image-capturing devices (CMOS image sensors) are configured to carry out digital CDS with a first signal and a second signal of which bit precisions are different.

The basic concept will be hereinafter explained.

When digital CDS is carried out with a first signal (N1 bit precision) and a second signal (N2 bit precision) of which bit precisions are different, the first and second ADCs of the present embodiment are configured as a counter having a bit shift circuit. In this case, for example, the counter is configured to count up and count down.

When such configuration is employed, it is not necessary to read the black level and the image data two times with the high bit precision and the low bit precision, which can prevent the frame rate of image-capturing process from being sacrificed. In addition, fixed pattern noise can be completely eliminated. Further, even if counter digital CDS based on up and down counting is applied, the image data can be prevented from being corrupted.

The present embodiment is described assuming a case where the first signal is obtained with high bit precision (N1>N2), but the present embodiment is not limited thereto. The digital CDS using bit shift can be achieved by bit-shifting the second signal to an upper side, or by bit-shifting the first signal to a lower side.

In the first ADC, a bit shift circuit configured with only a binary ripple counter will be explained.

A reference clock given to the flip flop of the least significant bit when the first signal is obtained is given to a flip flop of a bit higher by |N1−N2| bits when the second signal is obtained, so that the weights of the bits of each signal become the same, and this enables counter digital CDS.

The bit shift circuit can be achieved by a configuration for switching the entrance of the reference clock using a switch.

The following configuration may also be employed as another embodiment.

More specifically, the counter digital CDS can be achieved by a bit shift circuit configured such that the saved data of the first signal are saved, and the saved data are bit-shifted by |N1−N2| bits to the lower side, and are written to the latch in the ripple counter, whereby the second signal is read.

The second ADC will be explained in such configuration that the second ADC performs A/D conversion on a single piece of pixel data with multiple counters, in which the higher bits are for the binary ripple counter, and the lower bits are for the gray code counter.

In a conventional technique, synchronization of different counters is achieved by using the latch unit data corresponding to the most significant bit of the gray code counter as the carry signal.

The counter digital CDS can be achieved by providing a carry signal generation unit generating a carry signal shifted by |N1−N2| bits by logic synthesis of latch unit data of each bit of the gray code counter during bit shift.

The carry signal generation unit corresponds to the bit shift circuit.

In another embodiment, a method for bit-shifting the first signal to the lower side is also effective like the case of only the binary ripple counter.

At this occasion, it is possible to employ a method for converting data of the least significant side of the binary data into a gray code and storing it to the latch in the gray code counter and a method for providing a redundant flip flop at the least significant side of the binary ripple counter.

A carry mask signal for preventing bit inconsistency is not a mask for the carry signal but is a mask for original latch data generating the carry signal, so that the mask period for a carry signal made into a high frequency can be ensured.

The first ADC and the second ADC will be hereinafter explained in a specific manner.

<2.2 Entire Configuration Example of Solid-State Image-Capturing Device Having Column Parallel ADC>

Figure 9:
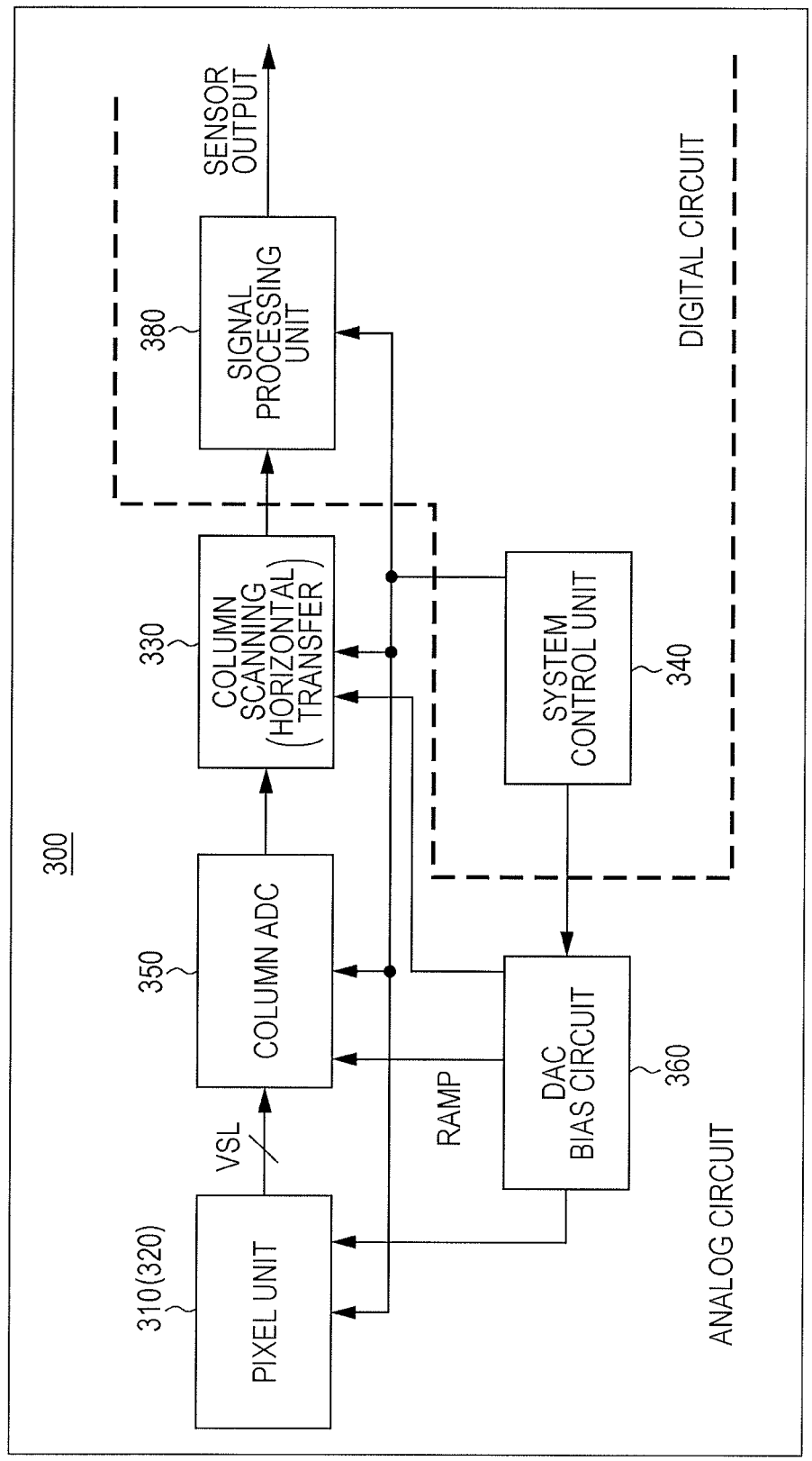
FIG. 9 is a block diagram illustrating a configuration example of a solid-state image-capturing device (CMOS image sensor) having the column parallel ADC according to the present embodiment.

FIG. 9 is a block diagram illustrating a configuration example of a solid-state image-capturing device having column parallel ADC (CMOS image sensor) according to the present embodiment.

Figure 10:
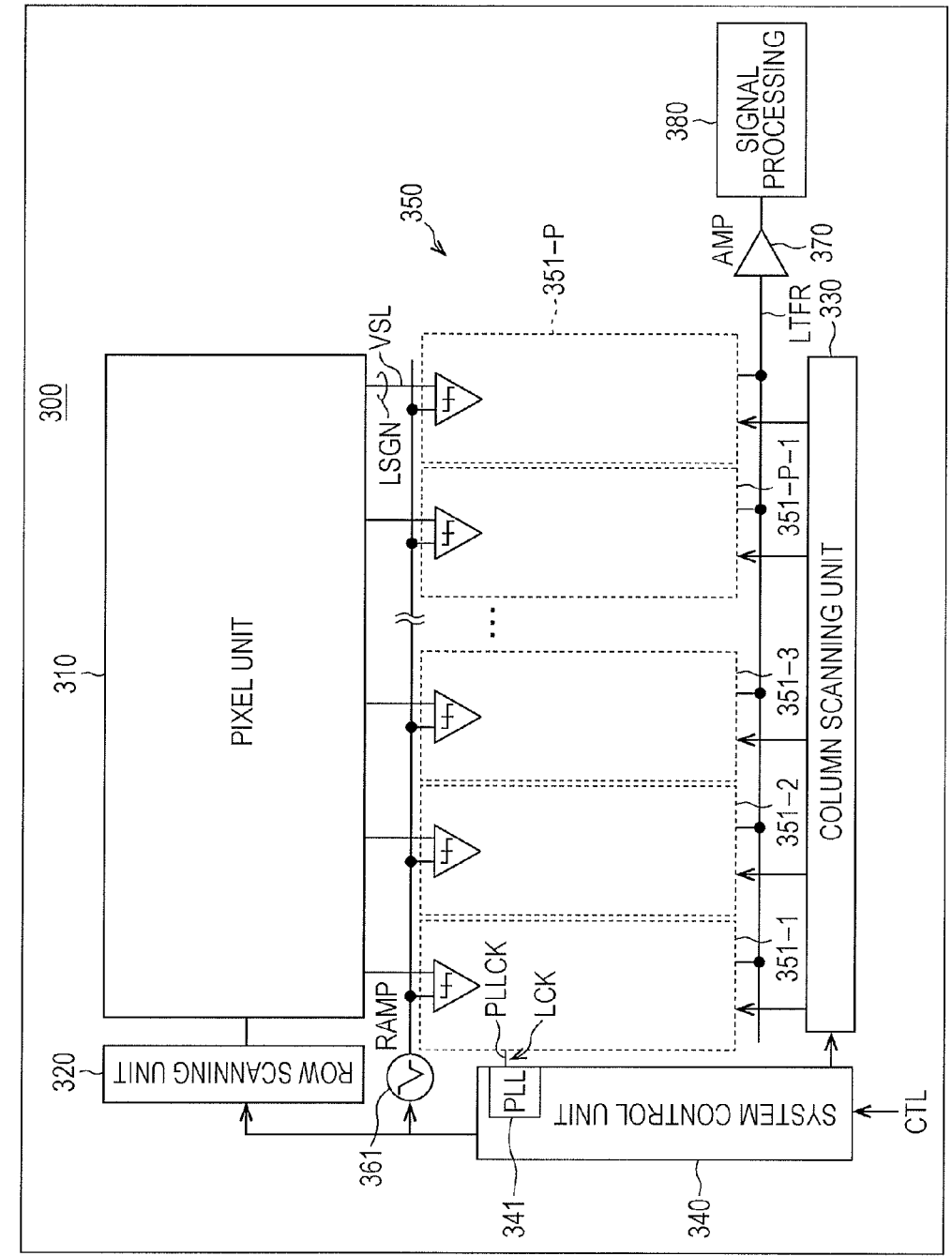
FIG. 10 is a block diagram more specifically illustrating an important portion of the solid-state image-capturing device (CMOS image sensor) having the column parallel ADC of FIG. 9.

FIG. 10 is a block diagram illustrating an important portion of the solid-state image-capturing device (CMOS image sensor) having the column parallel ADC of FIG. 9 in a more specific manner.

As shown in FIGS. 9 and 10, this solid-state image-capturing device 300 includes a pixel unit 310 serving as the image-capturing unit, a row (vertical) scanning unit 320, a column (horizontal transfer) scanning unit 330, a system control unit 340, and a column ADC 350 serving as the column signal processing unit of FIG. 7. It should be noted that the pixel signal reading unit is configured to include the row scanning unit 320 and the like.

The solid-state image-capturing device 300 includes a DAC and bias circuit 360 including a D/A conversion device 361 serving as the reference signal generation unit, an amplifier circuit (S/A) 370, and a signal processing unit 380.

Of these constituent elements, the pixel unit 310, the row scanning unit 320, the column scanning unit 330, the column ADC 350, the DAC and bias circuit 360, and the amplifier circuit (S/A) 370 are constituted by analog circuits.

The system control unit 340 and the signal processing unit 380 are constituted by digital circuits.

The column ADC 350 according to the present embodiment has the following distinctive configuration as described above.

In the column ADC 350, a single comparator receives ramp waves of different inclinations from the DAC (reference signal generation unit) 361, and captured images are obtained such that data are obtained with a high bit precision in a dark place, and data are obtained with a low bit precision in a bright place. Accordingly, the column ADC 350 is configured to obtain images with a high dynamic range.

Therefore, the column ADC 350 has the function for carrying out CDS in normal reading, and in addition, the column ADC 350 is configured to carry out digital CDS with a first signal (for example, read signal during P-phase) and a second signal (read signal during D-phase) of which bit precisions are different.

For this reason, when the column ADC 350 carries out digital CDS with a first signal (N1 bit precision) and a second signal (N2 bit precision) of which bit precisions are different, an up down counter having a bit shift circuit is employed.

The pixel unit 310 has, for example, pixels as shown in FIG. 8 arranged in a two-dimensional form (matrix form) having m rows and n columns, each including a photoelectric conversion device (photodiode) and a pixel amplifier.

The solid-state image-capturing device 300 is arranged with the following circuit serving as a control circuit for reading the signals of the pixel unit 310 in order.

More specifically, the solid-state image-capturing device 300 is arranged with a system (timing) control unit 340 generating an internal clock serving as a control circuit, a row scanning unit 320 controlling row address and row scanning, and a column scanning unit 330 controlling column address and column scanning.

The system control unit 340 generates a timing signal required for signal processing of the pixel unit 310, the row scanning unit 320, the column scanning unit 330, the column ADC 350, the DAC and bias circuit 360, and the signal processing unit 380.

The system control unit 340 includes a PLL circuit 341.

The PLL circuit 341 generates a reference clock PLLCK of a frequency fn (for example, 900 MHz) used for count operation of the column ADC 350.

The PLL circuit 341 outputs the clock to the clock supply line LCK supplying the clock to all the bit binary counters or a single gray code counter arranged for multiple columns of the column ADC 350.

The pixel unit 310 photoelectrically converts a video and a screen image for every pixel row by means of photon storage and discharge using a line shutter, and outputs an analog signal VSL to the column ADC 350 which is a column processing unit group.

In the column ADC 350, each column unit performs AD conversion to convert the analog output of the pixel unit 310 using the reference signal (ramp signal) RAMP from the DAC 361 and performs digital CDS, and outputs a digital signal having several bits.

For example, the column scanning unit 330 performs parallel transfer for transferring several channels at a time in order to ensure the transfer speed.

The signal processing unit 380 in a subsequent stage corrects vertical line defects and dot defects and performs clamp processing of signals, and performs digital signal processing such as parallel-serial conversion, compression, encoding, addition, average, intermittent operation.

In the solid-state image-capturing device 300 according to the present embodiment, the digital output of the signal processing unit 380 is transmitted as input of an ISP and a base band LSI.

The configuration and the functions of the column ADC 350 having the distinctive configuration according to the present embodiment will be hereinafter explained in details.

<2.3 Basic Configuration Example of First Column ADC>

Figure 11:
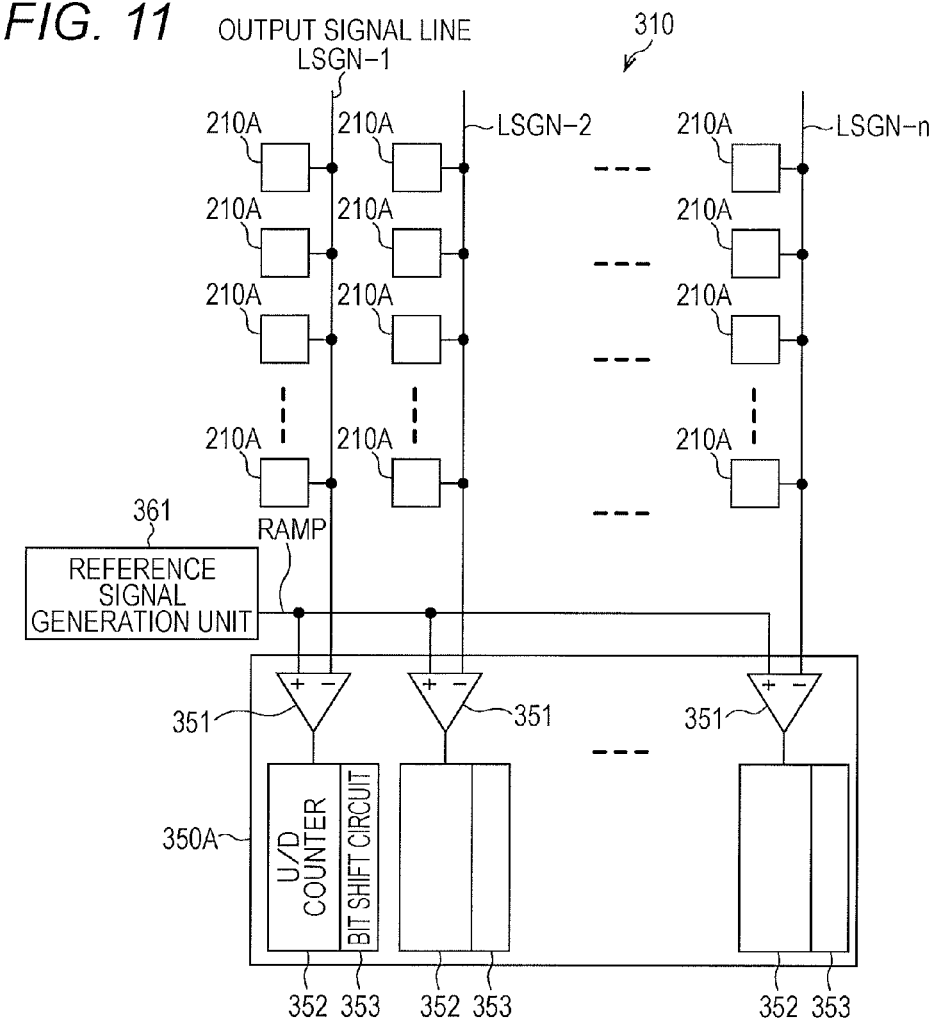
FIG. 11 is a figure illustrating a configuration example of a first column ADC (column A/D conversion device) according to the present embodiment.

FIG. 11 is a figure illustrating a configuration example of the first column ADC (column A/D conversion device) 350A according to the present embodiment.

In FIG. 11, the column ADC 350A as well as the pixel unit 310 are shown for the sake of easy understanding.

In the column ADC 350A of FIG. 11, a comparator 351 is provided for each column or multiple columns.

The input terminals of the comparator 351 receive the output signal line LSGN to which the pixel signal VSL is output and the ramp wave RAMP which is an output of the reference signal (reference voltage) generation unit (DAC) 361.

In the column ADC 350A, an U/D (up down) counter 352 controlled by inversion of the comparator 351 is provided for each column or multiple columns. The U/D counter 352 may also have a latch function.

In the present embodiment, each U/D counter 352 includes a bit shift circuit 353.

In the column ADC 350A, the basic digital CDS is performed as follows.

In the column ADC 350A, an analog signal (potential VSL) which is read from the signal line LSGN is compared by the comparator 351 provided for each column with the reference signal RAMP (slope waveform changing into a line form having a certain inclination).

At this occasion, the U/D counter 352 provided each column like the comparator 351 is operating, and any given potential Vslop of the ramp wave RAMP and the counter value change in such a manner that they are in a one-to-one correspondence. Accordingly, the potential (analog signal) VSL of the output signal line LSGN is converted into a digital signal.

The change of the reference signal RAMP is to convert the change of the voltage into the change of time, and the time is counted with a certain cycle (clock), whereby conversion into a digital value is achieved.

When the analog signal VSL and the reference signal RAMP cross each other, the output of the comparator 351 is inverted, and the input clock of the counter 352 is stopped, and the AD conversion is completed.

After the above AD conversion period is finished, the column scanning unit 330 inputs the data held in the latch into the signal processing unit 380 via the horizontal transfer line LTRF and the amplifier circuit 370, so that a two-dimensional image is generated.

Subsequently, in the first column ADC 350A, the bit shift digital CDS method using the bit shift circuit 353 functioning as the bit shift function unit will be explained.

In this case, for example, the bit precision of the first signal which is read signal during P-phase reading is denoted as N1, and the bit precision of the second signal which is read signal during D-phase reading is denoted as N2, and it is assumed that N1>N2 holds.

Figure 12:
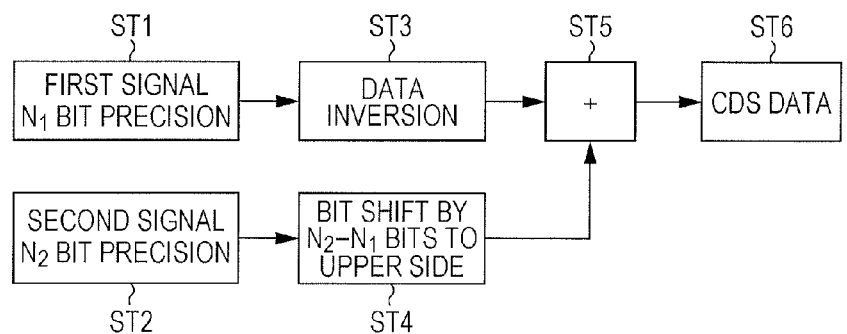
FIG. 12 is a figure for explaining a first bit shift digital CDS method using a bit shift circuit in a first column ADC.

FIG. 12 is a figure for explaining a first bit shift digital CDS method using the bit shift circuit 353 in the first column ADC 350A.

Figure 13:
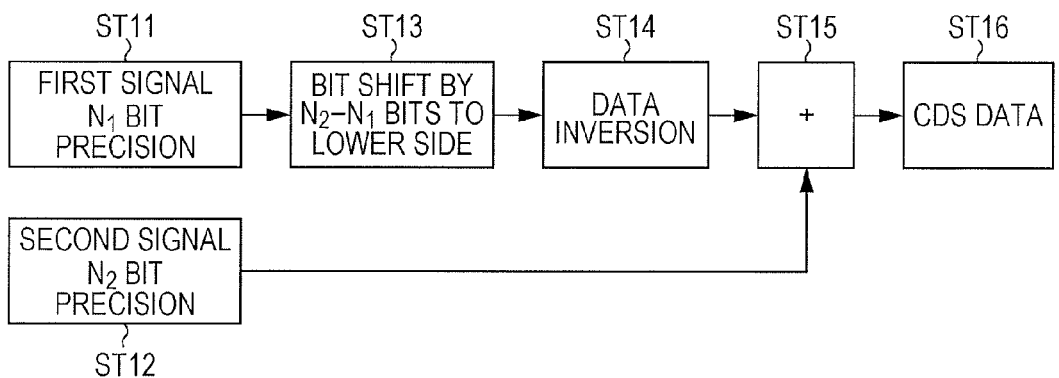
FIG. 13 is a figure for explaining a second bit shift digital CDS method using a bit shift circuit in the first column ADC.

FIG. 13 is a figure for explaining a second bit shift digital CDS method using the bit shift circuit 353 in the first column ADC 350A.

In the first bit shift digital CDS method of FIG. 12, the first signal is obtained with the bit precision N1 (ST1), and the second signal is obtained with the bit precision N2 (ST2).

After the first signal is obtained (ST1), one's complement number is derived to invert the storage data (ST3).

The second signal is shifted by (N2−N1) bits to the upper side (ST4), and the bit-shifted second signal is added to the first signal which is inverted in step ST3 explained above (ST5), and the digital CDS is achieved (ST6).

In the second bit shift digital CDS method of FIG. 13, the first signal is obtained with the bit precision N1 (ST11), and the second signal is obtained with the bit precision N2 (ST12).

After the first signal is obtained, the first signal is shifted by (N2−N1) bits to the lower side (ST13), and one's complement number is derived to invert the storage data (ST14). The second signal is added to the bit-shifted first signal (ST15), and the digital CDS is achieved (ST16).

Figure 14:
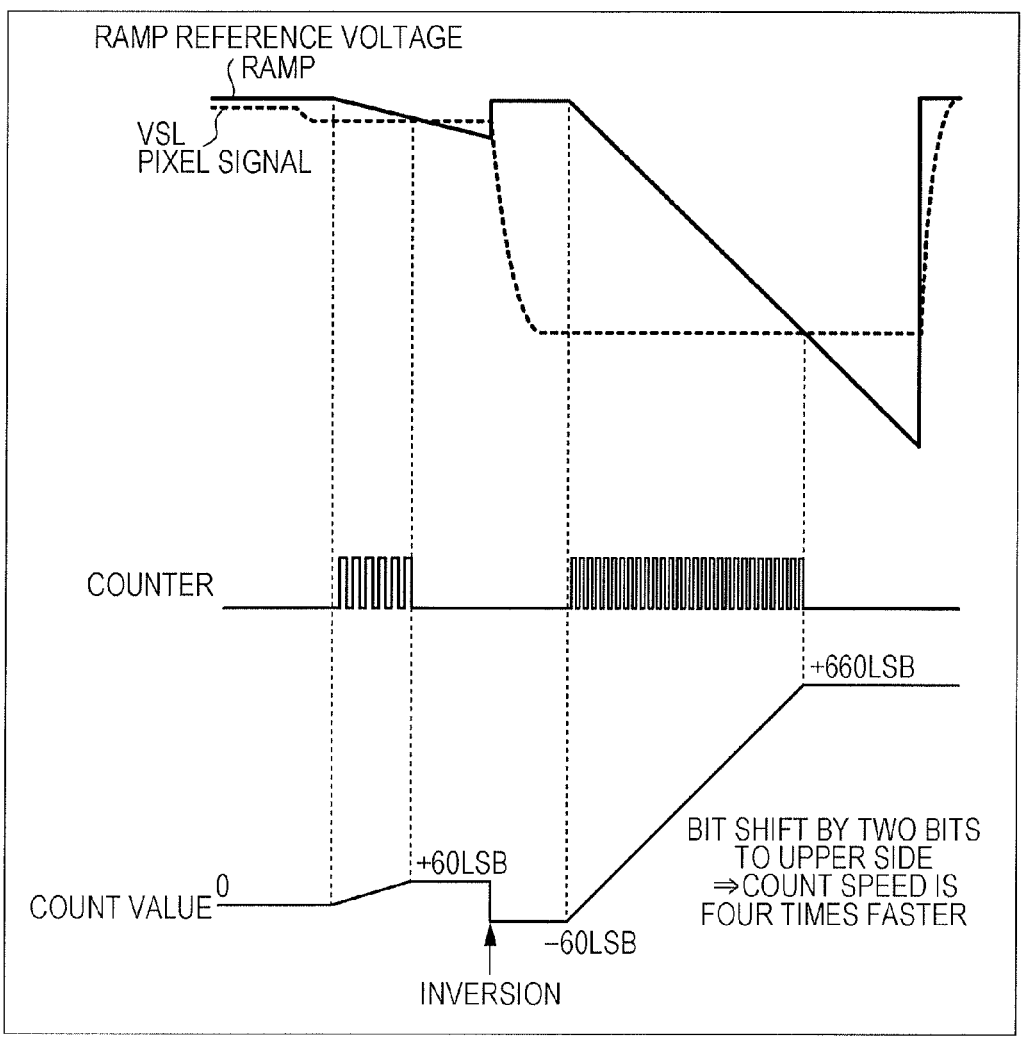
FIG. 14 is a figure illustrating a timing chart of the first bit shift digital CDS of FIG. 12.

FIG. 14 is a figure illustrating a timing chart of the first bit shift digital CDS of FIG. 12.

Figure 15:
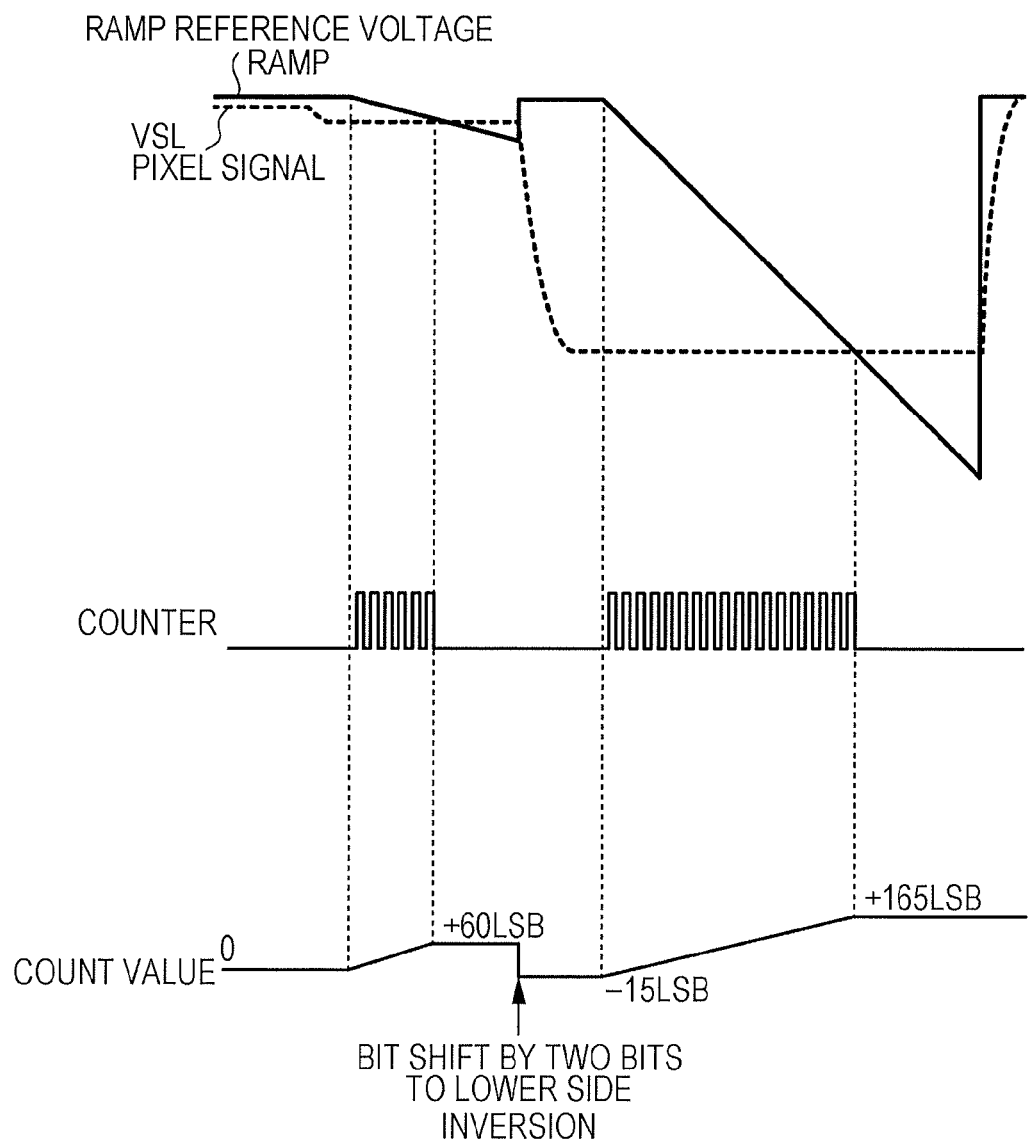
FIG. 15 is a figure illustrating a timing chart of the second bit shift digital CDS of FIG. 13.

FIG. 15 is a figure illustrating a timing chart of the second bit shift digital CDS of FIG. 13.

In the bit shift digital CDS, the comparator 351 compares the reference signal (voltage) which is a ramp wave with the pixel signal VSL, and the counter 352 counts the period in which the comparator 351 inverts the output, and the count value is output as a digital signal.

For example, when (N2−N1) is two bits, the inclination of the ramp wave when the second signal is obtained is four times the inclination of the ramp wave when the first signal is obtained.

In the example of FIG. 14, the count value of the first signal is +60 LSB, and before the second signal is obtained, one's complement number is derived to invert the data, thus it becomes −60 LSB. This is adopted as the count initial value when the second signal is obtained, and the counting is started with this count initial value, so that the first signal is subtracted.

When the second signal is obtained, the counter is shifted by two bits to the upper side, and therefore, the count speed is four times faster as compared with the case where the first signal is obtained.

In the example of FIG. 15, during the first signal inversion, the storage data +60 LSB is shifted by two bits to the lower side so that it becomes −15 LSB, and this is adopted as the count initial value when the second signal is obtained. At this occasion, the count speed when the first signal is obtained and the count speed when the second signal is obtained are the same.

<2.4 First Realization Example of Counter and Bit Shift System>

Figure 16:
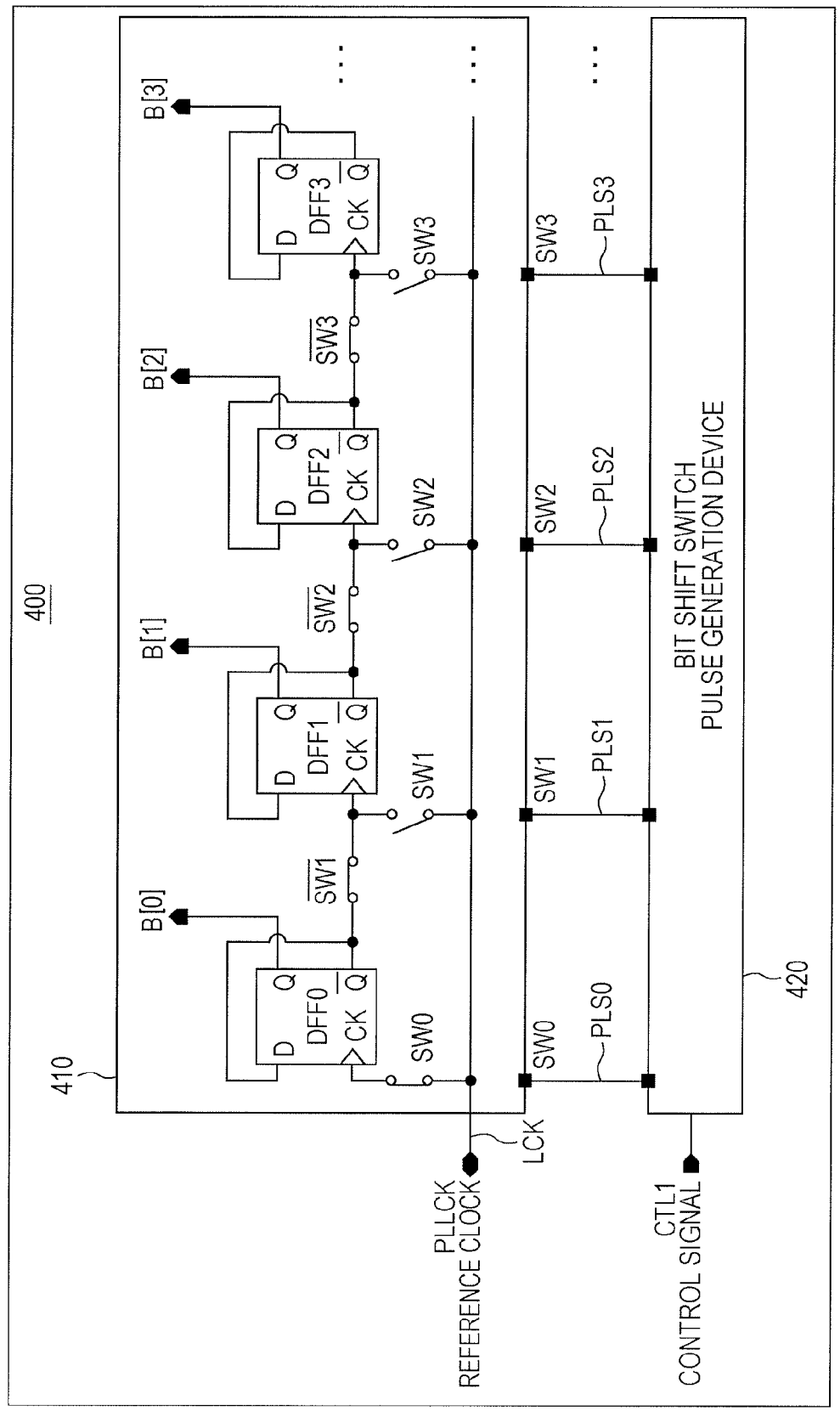
FIG. 16 is a figure illustrating a first realization example of a counter and bit shift system based on a binary ripple counter.

FIG. 16 is a figure illustrating a first realization example of a counter and bit shift system based on a binary ripple counter.

The counter and bit shift system 400 of FIG. 16 is configured to include a binary ripple counter 410 and a bit shift switch pulse generation device 420.

The binary ripple counter 410 is configured to include D-type flip flops DFF0 to DFF3, . . . , bit shift switches SW0 to SW3, . . . , and complementary switches /SW1 to /SW3, . . . .

The input terminal D of the D-type flip flop DFF0 is connected to the inversion output terminal /Q of the D-type flip flop DFF0. The clock input terminal CK of the D-type flip flop DFF0 is connected to the supply line LCK of the reference clock PLLCK via the bit shift switch SW0. The output terminal Q of the D-type flip flop DFF0 outputs a binary bit B[0].

The input terminal D of the D-type flip flop DFF1 is connected to the inversion output terminal /Q of the D-type flip flop DFF1. The clock input terminal CK of the D-type flip flop DFF1 is connected via the bit shift switch SW1 to the supply line LCK of the reference clock PLLCK. The output terminal Q of the D-type flip flop DFF1 outputs a binary bit B[1].

The input terminal D of the D-type flip flop DFF2 is connected to the inversion output terminal /Q of the D-type flip flop DFF2. The clock input terminal CK of the D-type flip flop DFF2 is connected via the bit shift switch SW2 to the supply line LCK of the reference clock PLLCK. The output terminal Q of the D-type flip flop DFF2 outputs a binary bit B[2].

The input terminal D of the D-type flip flop DFF3 is connected to the inversion output terminal /Q of the D-type flip flop DFF3. The clock input terminal CK of the D-type flip flop DFF3 is connected via the bit shift switch SW3 to the supply line LCK of the reference clock PLLCK. The output terminal Q of the D-type flip flop DFF3 outputs a binary bit B[3].

The inversion output terminal /Q of the D-type flip flop DFF0 is connected via the complementary switch /SW1 to the clock input terminal CK of the D-type flip flop DFF1 in the subsequent stage.

The inversion output terminal /Q of the D-type flip flop DFF1 is connected via the complementary switch /SW2 to the clock input terminal CK of the D-type flip flop DFF2 in the subsequent stage.

The inversion output terminal /Q of the D-type flip flop DFF2 is connected via the complementary switch /SW3 to the clock input terminal CK of the D-type flip flop DFF3 in the subsequent stage.

In the binary ripple counter 410, the switch SW0 turns on when the switch pulse PLS0 given by the bit shift switch pulse generation device 420 is at a high level, and the switch SW0 turns off when the switch pulse PLS0 given by the bit shift switch pulse generation device 420 is at a low level.

Likewise, the switch SW1 turns on when the switch pulse PLS1 given by the bit shift switch pulse generation device 420 is at a high level, and the switch SW1 turns off when the switch pulse PLS1 given by the bit shift switch pulse generation device 420 is at a low level.

The switch SW2 turns on when the switch pulse PLS2 given by the bit shift switch pulse generation device 420 is at a high level, and the switch SW2 turns off when the switch pulse PLS2 given by the bit shift switch pulse generation device 420 is at a low level.

The switch SW3 turns on when the switch pulse PLS3 given by the bit shift switch pulse generation device 420 is at a high level, and the switch SW3 turns off when the switch pulse PLS3 given by the bit shift switch pulse generation device 420 is at a low level.

The complementary switch /SW1 turns on and off complementarily to the bit shift switch SW1. More specifically, the complementary switch /SW1 turn off when the switch pulse PLS1 is at a high level, and the complementary switch /SW1 turn on when the switch pulse PLS1 is at a low level.

The complementary switch /SW2 turns on and off complementarily to the bit shift switch SW2. More specifically, the complementary switch /SW2 turn off when the switch pulse PLS2 is at a high level, and the complementary switch /SW2 turn on when the switch pulse PLS2 is at a low level.

The complementary switch /SW3 turns on and off complementarily to the bit shift switch SW3. More specifically, the complementary switch /SW3 turn off when the switch pulse PLS3 is at a high level, and the complementary switch /SW3 turn on when the switch pulse PLS3 is at a low level.

For example, the bit shift switch pulse generation device 420 selectively generates the switch pulses PLS0 to PLS3, . . . in accordance with the control signal CTL1 given by the system control unit 340, and provides the switch pulses PLS0 to PLS3, . . . to the binary ripple counter 410.

In the counter and bit shift system 400, the bit shift switches SW0 to SW3, . . . , the complementary switches /SW0 to /SW3, . . . , and the bit shift switch pulse generation device 420 correspond to the bit shift circuit 353 of FIG. 11.

In this counter and bit shift system 400, according to the switch control, the reference clock PLLCK can be input into the clock input terminals CK of the D-type flip flops DFF0 to DFF3, . . . corresponding to the bits of the binary ripple counter 410.

The bit shift switch pulse generation device 420 performs the switch control, and the switch pulses PLS0 to PLS3, are generated in response to the control signal CTL1 given by an external register of the system control unit 340 and the like.

The example of FIG. 16 shows a configuration of normal ripple counter before bit shift.

For example, the switch pulse LPS2 supplied to the bit shift switch SW2 is changed to the high level, and the other switch pulses PLS0, PLS1, PLS3, . . . are changed to the low level.

Accordingly, the bit shift switch SW2 turns on, and the other bit shift switches SW0, SW1, SW3, . . . turn off. The complementary switch /SW2 turns off, and the complementary switches /SW0, /SW1, /SW3, . . . turn on.

According to such switch control, the reference clock PLLCK goes into the D-type flip flop DFF2, and the counter operation can be achieved with two bits shifted to the upper side.

<2.5 Second Realization Example of Counter and Bit Shift System>

Figure 17:
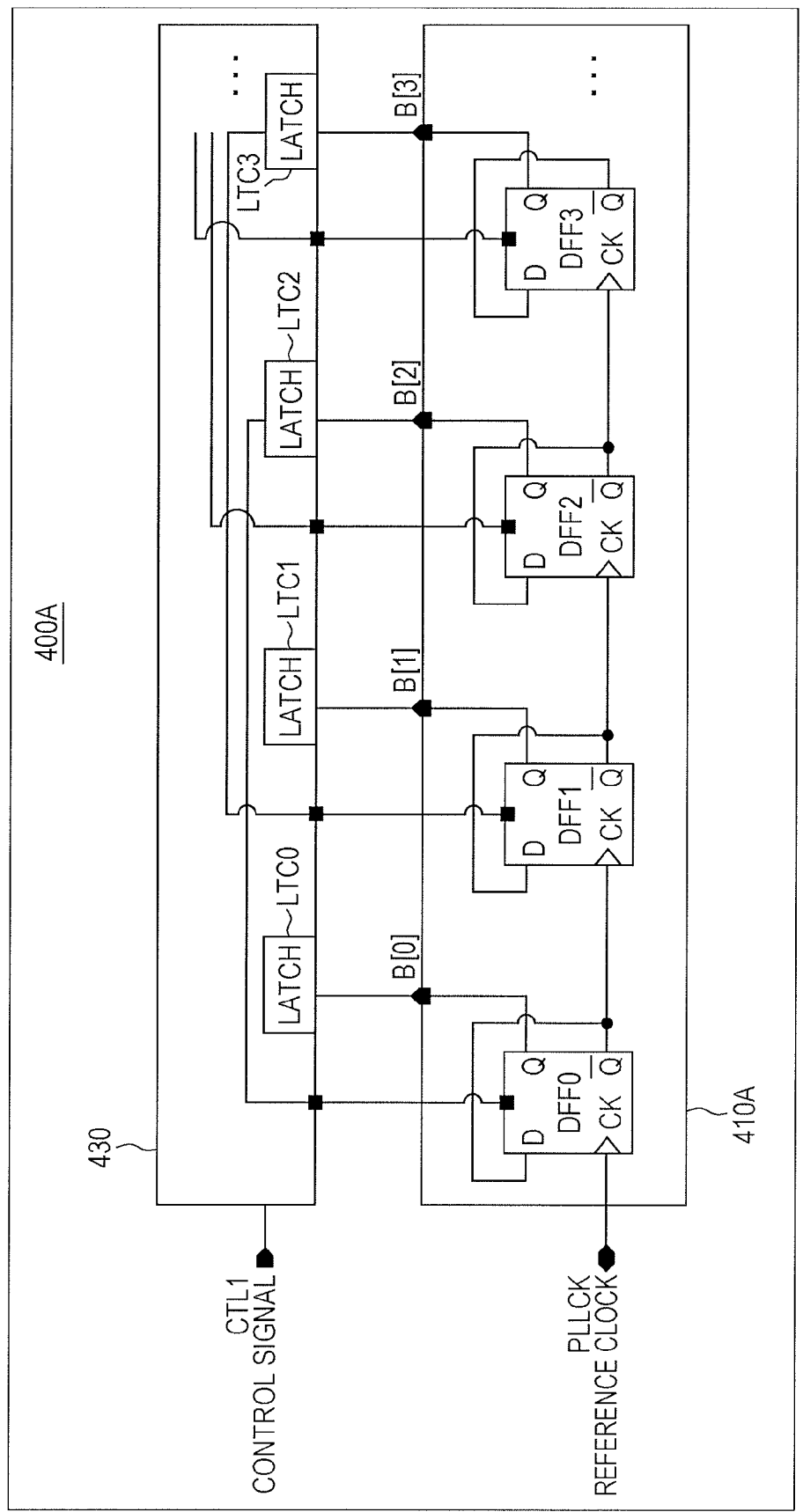
FIG. 17 is a figure illustrating a second realization example of a counter and bit shift system based on a binary ripple counter.

FIG. 17 is a figure illustrating a second realization example of a counter and bit shift system based on a binary ripple counter.

A counter and bit shift system 400A of FIG. 17 is an example of shifting two bits to the lower side.

A bit shift circuit 430 is constituted by latches LTC0 to LTC3, . . . , and a multiplexer, not shown.

A binary ripple counter 410A of FIG. 17 has a configuration obtained by deleting the bit shift switches SW1 to SW3, . . . , the complementary switches /SW0 to /SW3, . . . from the configuration of FIG. 16.

In the counter and bit shift system 400A, each bit output of the first signal is temporarily stored in the latches LTC0 to LTC3, . . . in the bit shift circuit 430.

In accordance with desired bit shift with the control signal CTL1, the data stored in the latches LTC0 to LTC3, . . . are written to the D-type flip flop DFF of the lower side.

It should be noted that the data inversion operation may be performed within the D-type flip flop independently from the bit shift, or may be performed in parallel with the bit shift within the bit shift circuit 430.

According to the first ADC explained above, the following effects can be obtained.

The counter digital CDS with different bit precisions can be done, and it is not necessary to obtain the first signal and the second signal with bit precisions, and therefore, the circuit can attain a higher speed.

The solid-state image-capturing device can obtain an image of a high dynamic range without degrading the frame rate.

The bit shift circuit may be a switch or a simple logic circuit, and therefore, as compared with multiple counters arranged for respective bit precisions and CDS processing performed in a downstream stage, the increase of the circuit size and the electric power consumption can be alleviated.

The first column ADC having the counters for all the bit binary codes arranged in an array form has been hereinabove explained.

Subsequently, the second column ADC having complex counters for the lower bit gray code and the higher bit binary code which are arranged in an array form will be explained.

<2.6 Basic Configuration Example of Second Column ADC>

Figure 18:
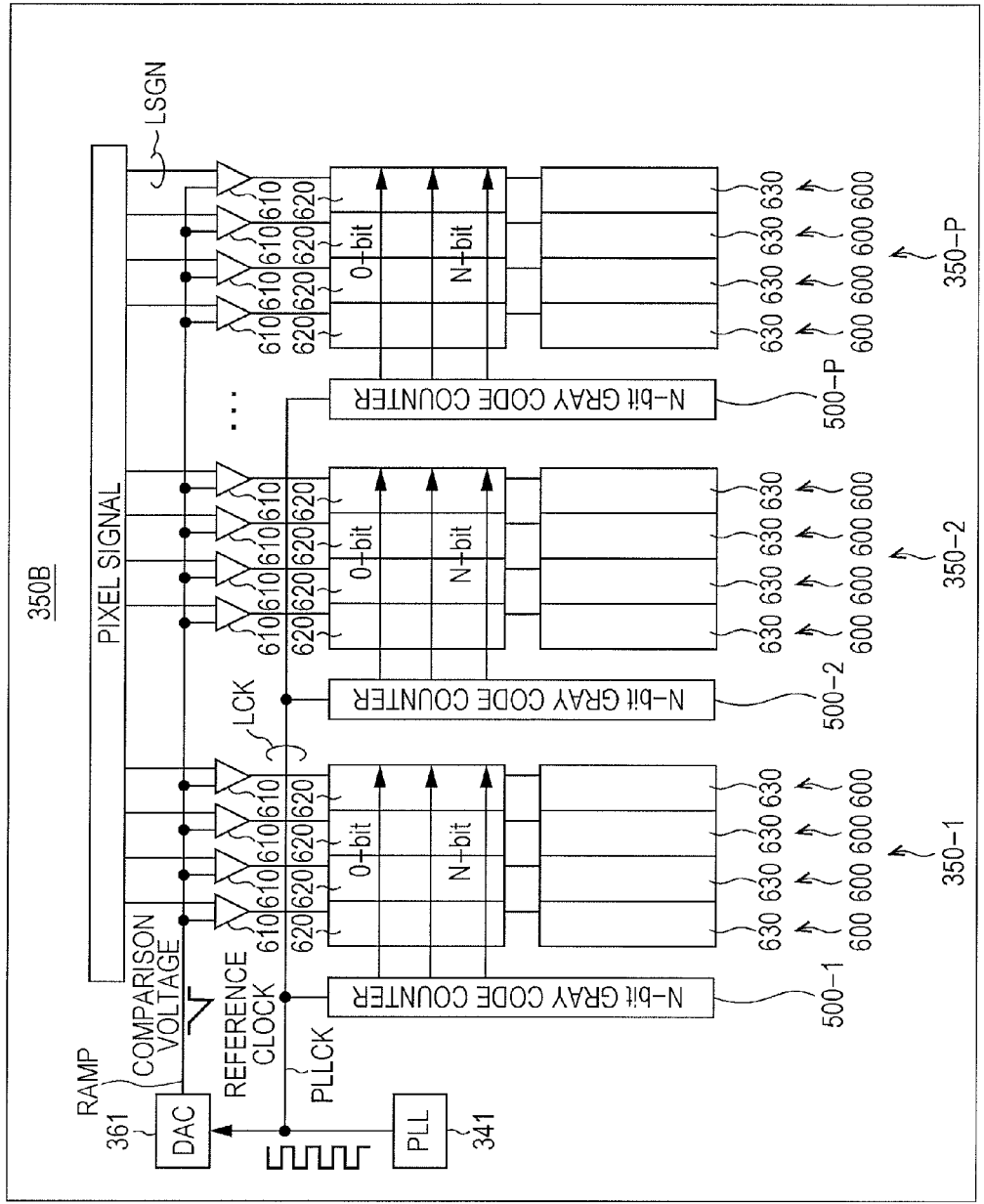
FIG. 18 is a first figure illustrating a basic configuration example of a second column ADC (column A/D conversion device) according to the present embodiment.
Figure 19:
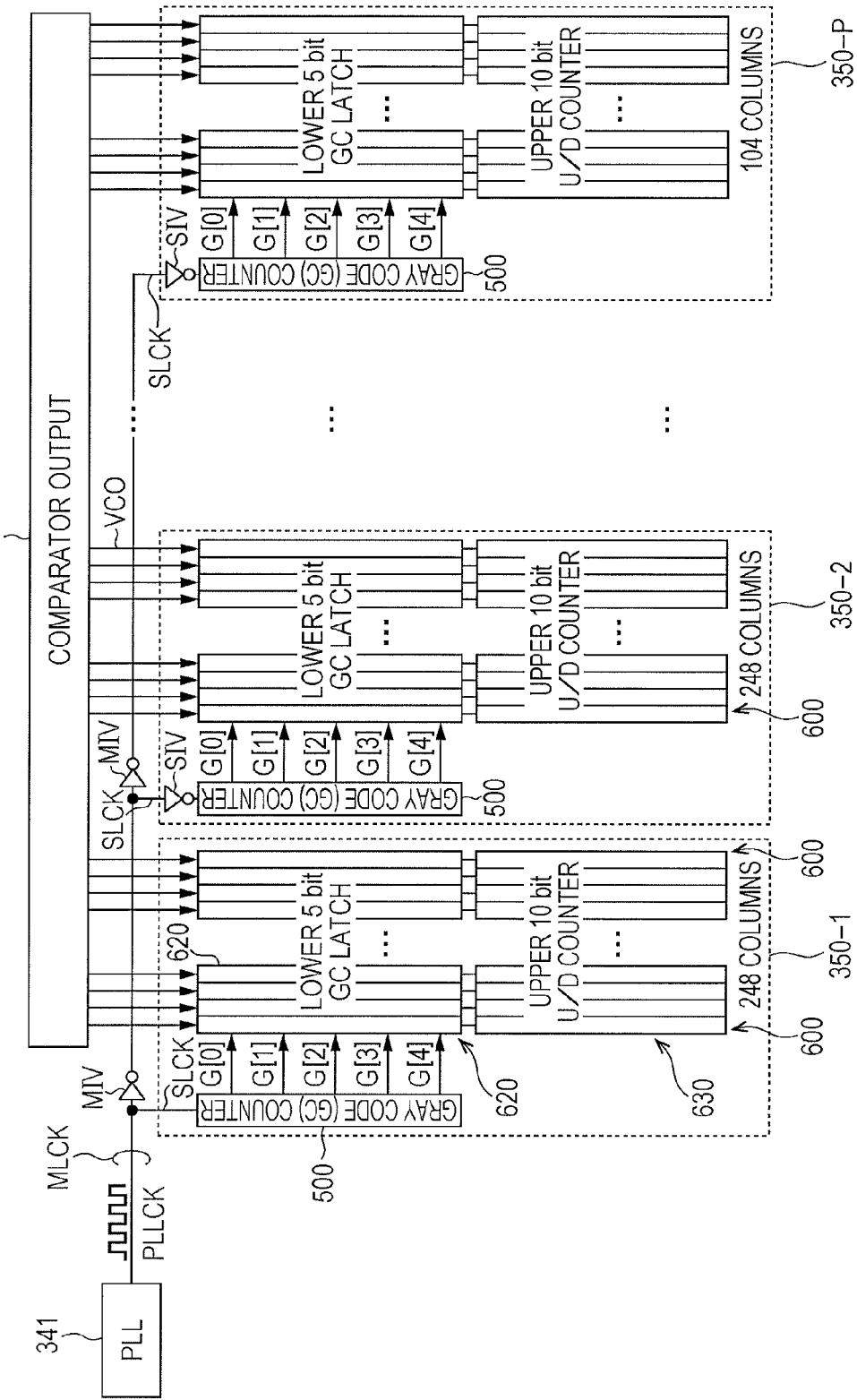
FIG. 19 is a second figure illustrating a basic configuration example of the second column ADC (column A/D conversion device) according to the present embodiment.

FIGS. 18 and 19 are figures illustrating a basic configuration example of a second column ADC (column A/D conversion device) 350B according to the present embodiment.

The second column ADC 350B consumes most of the electric power consumption of a normal column ADC, but since it is the lower bit of each column ripple counter, the second column ADC 350B is configured as follows.

The second column ADC 350B does not perform count operation of the lower bit of each column, and instead, employs a configuration for latching, each column, the output code of the N bit gray code counter performing counting in synchronization with the reference clock PLLCK, which is provided for multiple columns. Thus, the AD conversion value is determined.

In the second column ADC 350B according to the present embodiment, the reference clock PLLCK generated by the PLL circuit 341 of the system control unit 340 is input into only the gray code counters of several units.

Therefore, the burden of wiring is lighter, and the operating frequency can be increased.

In the second column ADC 350B according to the present embodiment, the count operation of the lower bit is not performed for each column, and therefore, the electric power consumption can be reduced.

In the second column ADC 350B, the ripple count operation for the upper bit of the counter can be performed using the N-th bit code (clock) of the counter output.

Therefore, the column digital CDS can be performed, and the size of area of the horizontal transfer wiring can also be reduced.

When an adder and the like are provided in a column, the second column ADC 350B can also be configured to perform so-called addition in a vertical (V) direction within a column with regard to the latched lower bit.

The second column ADC 350B according to the present embodiment can reduce the electric power consumption to about ⅛ of the full bit ripple counter method where the time resolution is the same.

The second column ADC 350B according to the present embodiment is configured as an ADC of the lower N bits and the upper M bits.

The second column ADC 350B according to the present embodiment is configured as, for example, an ADC having lower 5 bits and upper 10 bits.

The second column ADC 350B has multiple ADC blocks 350-1 to 350-P including multiple columns. In other words, the second column ADC 350B is divided into multiple ADC blocks in such a manner that multiple columns are in a single ADC block.

In the second column ADC 350B, a single one of gray code counters 500-1 to 500-P is provided for each of ADC blocks 350-1 to 350-P. The gray code counters 500-1 to 500-P function as a code conversion counter.

In each column, a column processing unit 600 is provided to perform comparison processing, lower bit latch, and higher bit count operation for each column.

It should be noted that the concept of the column processing unit in the second ADC of the present technique may include a gray code counter.

The column processing unit 600 has a comparator 610 comparing the reference signal RAMP which is the ramp wave, of which inclination is changed, generated by the DAC 361, and the analog signal VSL obtained by way of the output signal line LSGN from pixels for each row line.

The column processing unit 600 has a lower bit gray code latch unit 620 of lower N bits for latching the count value upon receiving the count results of the gray code counters 500-1 to 500-P and the output of the comparator 610.

The column processing unit 600 has a higher bit U/D (up down) counter (ripple counter) unit 630 for upper M bits performing the count operation upon receiving the latch output of the uppermost side lower bit latch circuit of the lower bit gray code latch unit 620.

It should be noted that the latch counter unit is formed by the lower bit gray code latch unit 620 and the higher bit U/D counter unit 630.

The first counter is formed by the gray code counter 500 and the lower bit gray code latch unit 620. The second counter is formed by the higher bit U/D counter unit 630.

In the present embodiment, the reference signal RAMP is generated as a ramp wave in which, for example, the voltage value changes in a line form over time.

The comparator 610 of each column processing unit 600 compares the reference signal RAMP and the analog signal VSL that is read to the output signal line LSGN from the pixel of the pixel unit 310 of which address is designated.

In this case, before the reference signal RAMP matches the analog signal VSL, the comparator 610 outputs the output signal VCO at the high level. When the reference signal RAMP matches the analog signal VSL, the comparator 610 inverts the level of the output signal VCO from the high level to the low level.

In the present embodiment, lower bit gray code latch unit 620 performs latch operation to latch the gray codes GC[0] to GC "4" in response to the trigger that the output level of the output signal VCO of the comparator 610 is inverted.

<2.7 Configuration Example of Gray Code Counter>

Each gray code counter 500 generates N bits gray code GC which is a digital code upon receiving the reference clock PLLCK of, for example, a frequency fn (MHz), which is generated by the PLL circuit 341 of the system control unit 340 and transmitted through the clock supply line LCK.

The gray code GC having multiple N bits is formed as a code with which level transition occurs between a logic [0] and a logic [1] which are of only a single bit.

The gray code counter 500 according to the present embodiment receives the reference clock PLLCK of the frequency fn and performs the count operation, and generates gray codes GC[0] to GC[4] having 5(=N) bits of divided frequencies.

The gray code counter 500 generates a lowest most gray code GC[0] of a frequency (½) fn, generates a gray code GC[1] of a frequency (¼) fn, and generates a gray code GC[2] of a frequency (⅛) fn MHz.

The gray code counter 500 generates a gray code GC[3] of a frequency (1/16) fn and an uppermost gray code GC[4].

Each gray code counter 500 provides the generated gray codes to the lower bit gray code latch units 620 for the multiple columns included in the same ADC blocks 350-1 to 350-P.

The gray code counter 500 generates the binary codes PG[0] to PG[4] at the rising edge of the input reference clock PLLCK, and generates the input clock and the binary codes PG "[0] to PG[4].

Then, the bits are synchronized again using the clock CK of the same frequency as the reference clock PLLCK and the inversion signal XCK thereof, and the gray codes GC[0] to GC[4] are output.

Each gray code counter 500 outputs the generated gray code to the lower bit gray code latch units 620 for the multiple columns included in the same ADC blocks 350-1 to 350-P.

[Transmission of Reference Clock PLLCK]

In the present embodiment, the configuration as shown in FIG. 19 is employed in order to prevent deformation of the duty of the reference clock PLLCK transmitted through the clock supply line LCK.

More specifically, in the main clock supply line MLCK wired from the output unit of the PLL circuit 341 to all the columns, each main inverter MIV made by a single CMOS buffer is used as a repeater.

Then, a sub-inverter SIV serving as an inversion circuit is selectively provided so that the reference clock PLLCK is provided in the positive logic to the sub-clock supply line SLCK branching to the gray code counter 500 of each of ADC blocks 350-1 to 350-P.

In the example of FIG. 19, the main inverter MIV serving as the repeater is not interposed for the gray code counter 500-1 of the ADC block 350-1, and therefore, the sub-inverter SIV is not provided in the sub-clock supply line SLCK.

The main inverter MIV serving as the repeater is interposed for the gray code counter 500-2 of the ADC block 350-2, and therefore, the sub-inverter SIV is provided in the sub-clock supply line SLCK.

The configuration is hereinafter made in the same manner.

When such configuration is employed, the reference clock PLLCK can be transmitted to the supply-destination gray code counter 500 while preventing deformation of the duty of the high speed reference clock PLLCK of about frequency fn (MHz) and still maintaining about 50%.

The second ADC 350B employs the bit shift method in which lower several bits are configured for a single gray code counter 500 provided for multiple columns, and the remaining high bits are configured for a single U/D counter (binary ripple counter) provided for each column.

FIGS. 18 and 19 are examples for counting the lower five bits with the gray code counter 500.

As described above, a single gray code counter 500 is provided for multiple columns, and the gray code data are stored to the lower bit gray code latch unit 620 provided for each column when the output of the comparator 610 is inverted.

The carry signal CRY generated from the gray code latch unit 620 provided for each column is input into the least significant bit of the U/D counter unit 630 of the upper side.

In this configuration, a single counter of the lower bits of high frequency is provided for multiple columns, and the U/D counter unit 630 provided for each column operates at a lower frequency for the high bits. Therefore, there is an advantage in that the electric power consumption can be greatly reduced as compared with the method in which the U/D counter operates on each column for the entire bits.

<2.8 First Configuration Example of Column Processing Unit>

Figure 20:
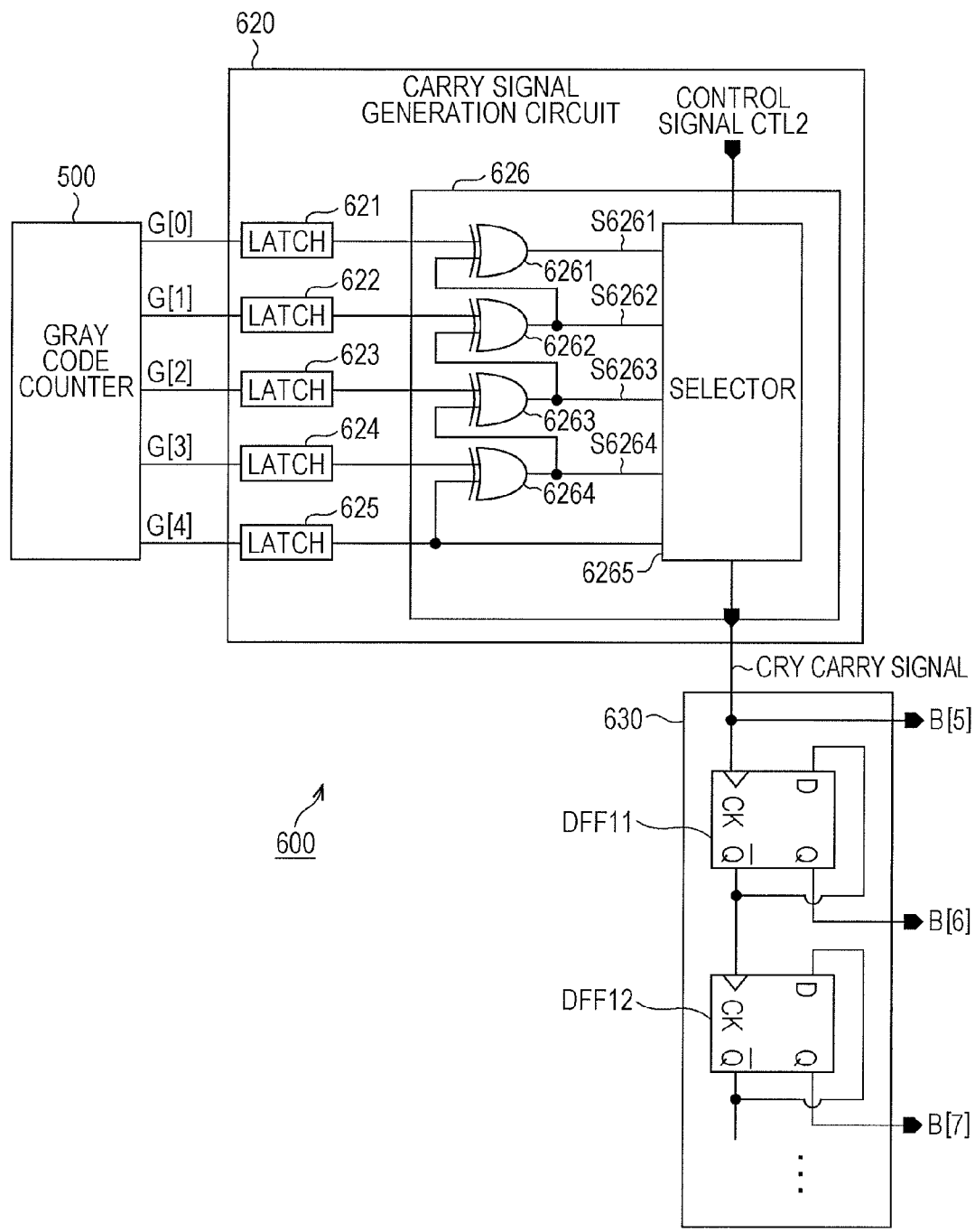
FIG. 20 is a figure illustrating a specific configuration example of a gray code latch unit and a U/D counter (ripple counter) unit of a column processing unit of the second ADC according to the present embodiment.

FIG. 20 is a figure illustrating a specific first configuration example of a gray code latch unit and U/D counter (ripple counter) unit of a column processing unit 600 of a second ADC according to the present embodiment.

Figure 21:
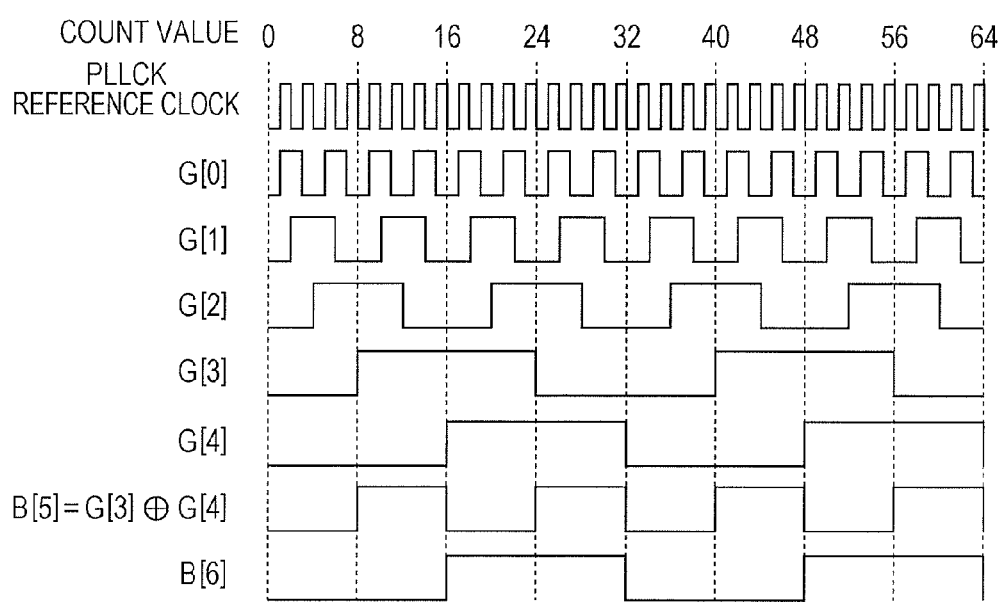
FIG. 21 is a timing chart illustrating a circuit of FIG. 20.

FIG. 21 is a timing chart illustrating the circuit of FIG. 20.

In FIG. 20, the gray code latch unit 620 includes gray code latches 621 to 625 which latch the gray codes GC[0] to GC[4] by the gray code counter 500, and a carry signal generation circuit 626 functioning as the bit shift function unit.

The carry signal generation circuit 626 includes exclusive OR gates (EXOR) 6261 to 6264 and a selector (multiplexer) 6265.

The EXOR 6261 derives an exclusive OR between the gray code G[0] latched in the gray code latch 621 and the output signal S6262 of the EXOR 6262, and outputs the result as the signal S6261 to the selector 6265.

The EXOR 6262 derives an exclusive OR between the gray code G[1] latched in the gray code latch 622 and the output signal S6263 of the EXOR 6263, and outputs the result as the signal S6262 to the selector 6265 and the EXOR 6261.

The EXOR 6263 derives an exclusive OR between the gray code G[2] latched in the gray code latch 623 and the output signal S6264 of the EXOR 6264, and outputs the result as the signal S6263 to the selector 6265 and the EXOR 6262.

The EXOR 6264 derives an exclusive OR between the gray code G[3] latched in the gray code latch 624 and the gray code G[4] latched in the gray code latch 625, and outputs the result as the signal S6264 to the selector 6265 and the EXOR 6263.

For example, in accordance with the control signal CTL2 given by the system control unit 340, the selector 6265 selects any one of the output signals S6261 to S6264 of the EXORs 6261 to 6264 and the gray code G[4] latched in the gray code latch 625.

The selector 6265 outputs the selected signal as the carry signal CRY to the U/D counter (rip counter) unit 630 in the subsequent stage.

The U/D (binary ripple) counter unit 630 is configured to include multiple D-type flip flops DFF11, DFF12, . . . .

The U/D counter unit 630 outputs the carry signal CRY, which is output from the gray code latch unit 620 in the previous stage, as the lower bit B[5].

The carry signal CRY is provided to the clock input terminal CK of the D-type flip flop DFF11 in the first stage.

The input terminal D of the D-type flip flop DFF11 is connected to the inversion output terminal /Q of the D-type flip flop DFF11. This inversion output terminal /Q of the D-type flip flop DFF11 is connected to the clock input terminal CK of the D-type flip flop FDD12 in the subsequent stage. The output terminal Q of the D-type flip flop DFF11 outputs the binary bit B[6].

Likewise, the input terminal D of the D-type flip flop DFF 12 is connected to the inversion output terminal /Q of the D-type flip flop DFF 12. This inversion output terminal /Q of the D-type flip flop DFF 12 is connected to the clock input terminal CK of a D-type flip flop in a subsequent stage, not shown. The output terminal Q of the D-type flip flop DFF12 outputs the binary bit B[7].

In the configuration of FIG. 20, the carry signal CRY driving the U/D counter unit 630 is generated by logic synthesis based on data of the gray code latches 621 to 625, and therefore, the synchronization of the count timing between the gray code counter 500 and the U/D counter unit 630 is guaranteed.

For example, the signal S6264 obtained by deriving the exclusive OR between the gray code G[4] and the gray code G[3] is selected by the selector 6265, and is output as the carry signal CRY, so that the gray code can be shifted by two bits to the upper side.

The carry signal generation circuit 626 of FIG. 20 is an example, but as described above, all the bit shift carry signal generation can be done by logic synthesis of the gray code latch unit 620.

The carry signal generation circuit 626 of FIG. 20 is an example of realization example, but the embodiment is not limited thereto because this can be realized by any combination of logic circuits.

<2.9 Second Configuration Example of Column Processing Unit>

Figure 22:
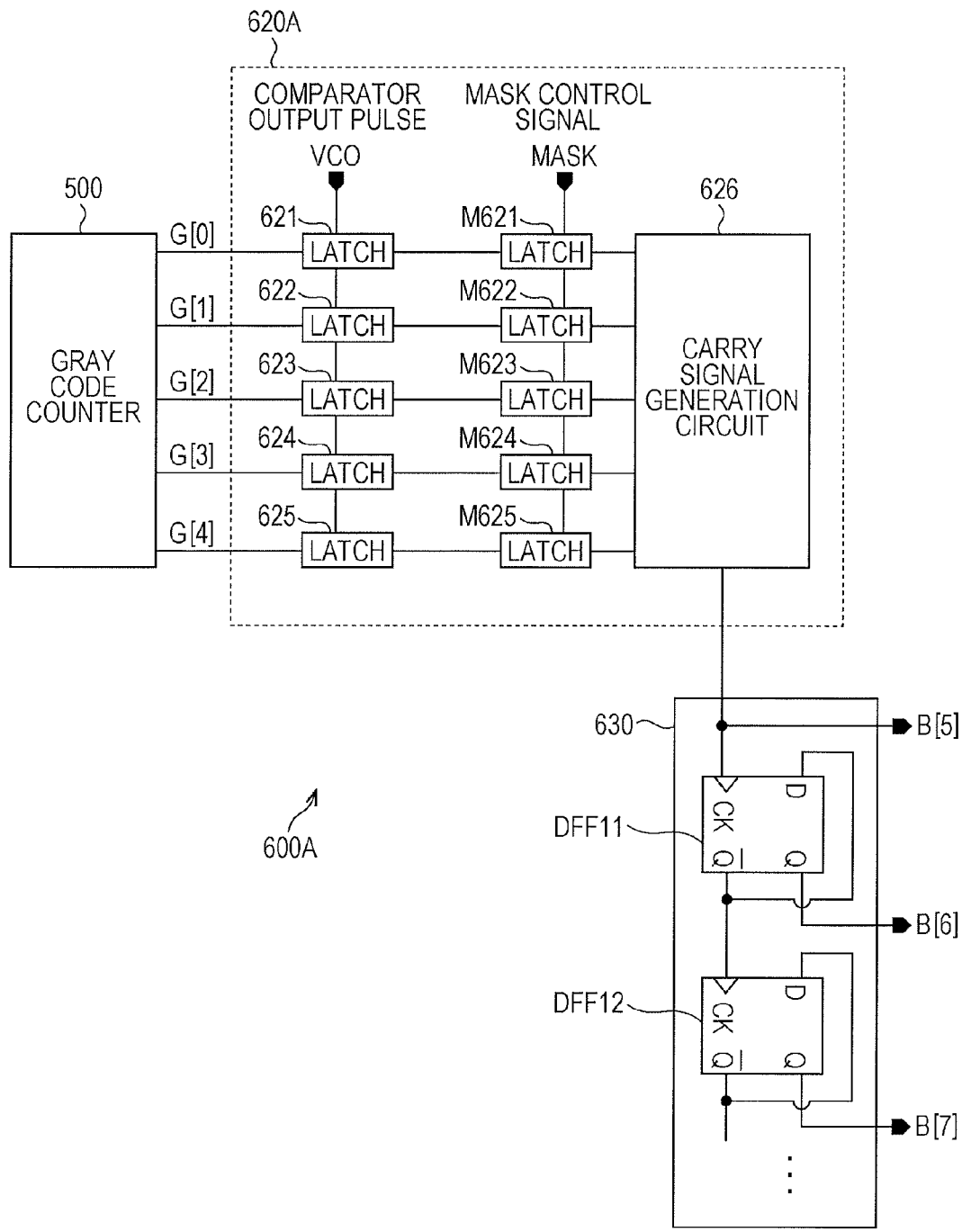
FIG. 22 is a figure illustrating a specific second configuration example of a gray code latch unit and a U/D counter (ripple counter) unit of the column processing unit of the second ADC according to the present embodiment.

FIG. 22 is a figure illustrating a specific second configuration example of a gray code latch unit and U/D counter (ripple counter) unit of the column processing unit of the second ADC according to the present embodiment.

Figure 23:
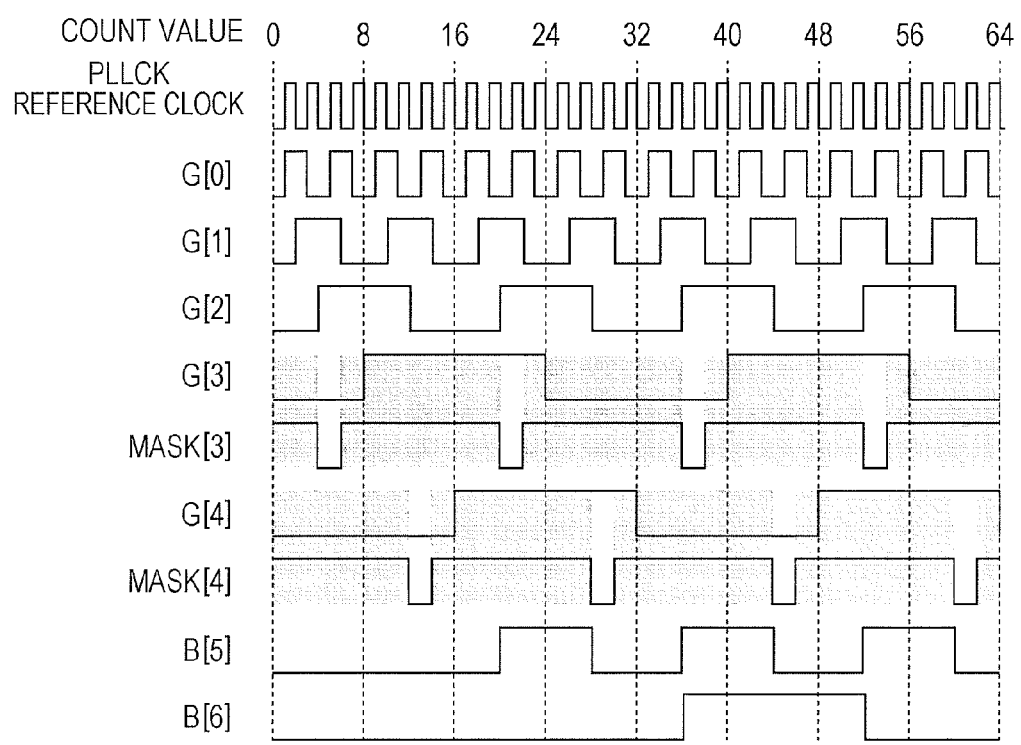
FIG. 23 is a timing chart illustrating a circuit of FIG. 22.

FIG. 23 is a timing chart of a circuit of FIG. 22.

By the way, the carry signal requires countermeasure for solving bit inconsistency (metastable).

The bit inconsistency means that, for example, when the edge of the carry signal is close to the time for the output inversion of the comparator 610, there is no carry in the gray code, but carry occurs in B[5] of the binary code, so that data hops by 32 LSB.

For example, in Patent Document 3, this is avoided by making a mask period for the edge timing of the carry signal. When the bit shift is performed, the frequency of the carry becomes higher (for example, the frequency is four times higher as a result of two bits shift), and therefore, the mask period may be insufficient with the same mask method as the technique already suggested.

Therefore, in the present embodiment, like the configuration of the column processing unit 600A as shown in FIG. 22, the data in the gray code latches 621 to 625 generating the carry signal CRY are masked by the mask circuits M621 to M625.

FIG. 23 is an example where the mask periods are taken for the gray code G[4] and the gray code G[3] generating the carry signal during two bits shift.

The mask control signals MASK[3], MASK[4] determining the mask periods are generated by logic synthesis from the gray code latch unit.

In this example, the carry signal is generated by deriving the exclusive OR between the gray code G[3] and the gray code G[4], and bit inconsistency may occur at both of the rising and falling edges. Therefore, the mask periods are provided for both of the edges.

Unless it is guaranteed to start the mask before the edge, the mask period after the edge is not limited to what is shown in FIG. 23. When the mask period after the edge is longer, the problem of the bit inconsistency can be solved.

<2.10 Third Configuration Example of Column Processing Unit>

Figure 24:
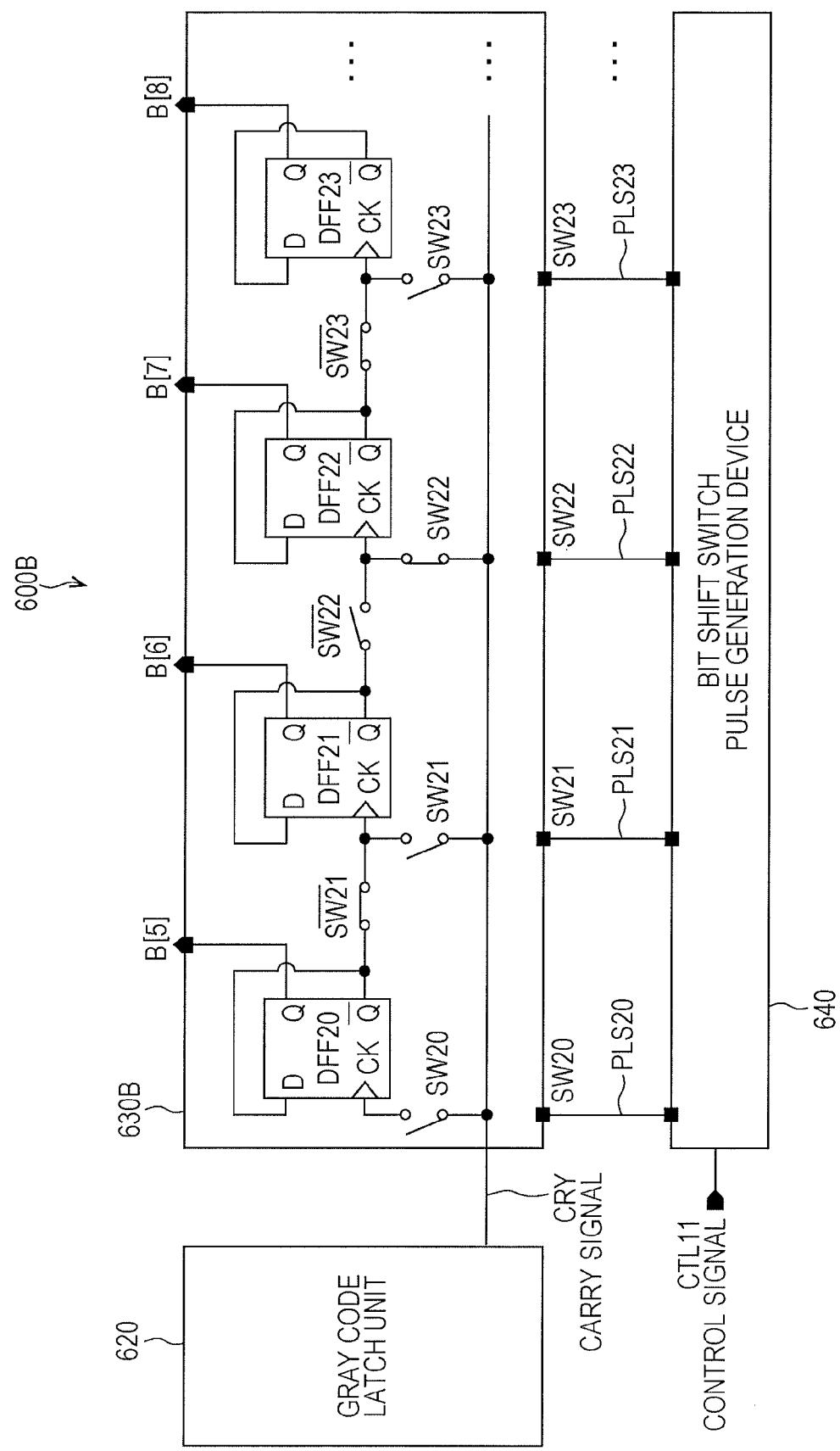
FIG. 24 is a figure illustrating a specific third configuration example of a gray code latch unit and a U/D counter (ripple counter) unit of the column processing unit of the second ADC according to the present embodiment.

FIG. 24 is a figure illustrating a specific third configuration example of a gray code latch unit and U/D counter (ripple counter) unit of the column processing unit of the second ADC according to the present embodiment.

FIG. 24 shows a configuration in which two bits shift to the upper side is realized in the U/D counter unit 630B without changing the carry signal of the gray code latch unit 620 as shown in FIGS. 20 and 21.

Basically, this has the same configuration as the counter and bit shift system 400 explained with reference to FIG. 16. In this example, this is achieved as follows: the carry signal CRY is the reference clock, and the input of the carry signal CRY is switched according to the switch control of the bit shift circuit.

The column processing unit 600B of FIG. 24 is configured to include a U/D (binary ripple) counter unit 630B and a bit shift switch pulse generation device 640.

The U/D (binary ripple) counter unit 630B is configured to include D-type flip flops DFF20 to DFF23, . . . , bit shift switches SW20 to SW23, . . . , and complementary switches /SW21 to /SW23, . . . .

The input terminal D of the D-type flip flop DFF 20 is connected to the inversion output terminal /Q of the D-type flip flop DFF 20. The clock input terminal CK of the D-type flip flop DFF 20 is connected via the bit shift switch SW20 to the supply line of the carry signal CRY. The output terminal Q of the D-type flip flop DFF20 outputs the binary bit B[5].

The input terminal D of the D-type flip flop DFF 21 is connected to the inversion output terminal /Q of the D-type flip flop DFF 21. The clock input terminal CK of the D-type flip flop DFF 21 is connected via the bit shift switch SW21 to the supply line of the carry signal CRY. The output terminal Q of the D-type flip flop DFF21 outputs the binary bit B [6].

The input terminal D of the D-type flip flop DFF 22 is connected to the inversion output terminal /Q of the D-type flip flop DFF 22. The clock input terminal CK of the D-type flip flop DFF 22 is connected via the bit shift switch SW22 to the supply line of the carry signal CRY. The output terminal Q of the D-type flip flop DFF22 outputs the binary bit B [7].

The input terminal D of the D-type flip flop DFF 23 is connected to the inversion output terminal /Q of the D-type flip flop DFF 23. The clock input terminal CK of the D-type flip flop DFF 23 is connected via the bit shift switch SW23 to the supply line of the carry signal CRY. The output terminal Q of the D-type flip flop DFF23 outputs the binary bit B [8].

The inversion output terminal /Q of the D-type flip flop DFF20 is connected to the clock input terminal CK of the D-type flip flop DFF21 in the subsequent stage via the complementary switch /SW21.

The inversion output terminal /Q of the D-type flip flop DFF21 is connected to the clock input terminal CK of the D-type flip flop DFF22 in the subsequent stage via the complementary switch /SW22.

The inversion output terminal /Q of the D-type flip flop DFF22 is connected to the clock input terminal CK of the D-type flip flop DFF23 in the subsequent stage via the complementary switch /SW23.

In the U/D (binary ripple) counter unit 630B, when the switch pulse PLS20 given by the bit shift switch pulse generation device 640 is at a high level, the switch SW20 turns on, and when the switch pulse PLS20 given by the bit shift switch pulse generation device 640 is at a low level, the switch SW20 turns off.

Likewise, when the switch pulse PLS21 given by the bit shift switch pulse generation device 640 is at a high level, the switch SW21 turns on, and when the switch pulse PLS21 given by the bit shift switch pulse generation device 640 is at a low level, the switch SW21 turns off.

When the switch pulse PLS22 given by the bit shift switch pulse generation device 640 is at a high level, the switch SW22 turns on, and when the switch pulse PLS22 given by the bit shift switch pulse generation device 640 is at a low level, the switch SW22 turns off.

When the switch pulse PLS23 given by the bit shift switch pulse generation device 640 is at a high level, the switch SW23 turns on, and when the switch pulse PLS23 given by the bit shift switch pulse generation device 640 is at a low level, the switch SW23 turns off.

The complementary switch /SW21 turns on and off complementarily to the bit shift switch SW21. More specifically, the complementary switch /SW21 turn off when the switch pulse PLS21 is at a high level, and the complementary switch /SW21 turn on when the switch pulse PLS21 is at a low level.

The complementary switch /SW22 turns on and off complementarily to the bit shift switch SW22. More specifically, the complementary switch /SW22 turn off when the switch pulse PLS22 is at a high level, and the complementary switch /SW22 turn on when the switch pulse PLS22 is at a low level.

The complementary switch /SW23 turns on and off complementarily to the bit shift switch SW23. More specifically, the complementary switch /SW23 turn off when the switch pulse PLS23 is at a high level, and the complementary switch /SW23 turn on when the switch pulse PLS23 is at a low level.

For example, the bit shift switch pulse generation device 640 selectively generates the switch pulses PLS20 to PLS23, in accordance with the control signal CTL11 given by the system control unit 340, and provides the switch pulses PLS20 to PLS23, . . . to the U/D (binary ripple) counter unit 630B.

In the U/D (binary ripple) counter unit 630B, the bit shift switches SW20 to SW23, . . . , the complementary switches /SW20 to /SW23, . . . , and the bit shift switch pulse generation device 640 correspond to the bit shift circuit 353 of FIG. 11.

In this column processing unit 600B, according to the switch control, the carry signal CRY serving as the reference clock can be input into the clock input terminals CK of the D-type flip flops DFF20 to DFF23, . . . corresponding to the bits of the U/D (binary ripple) counter unit 630B.

The bit shift switch pulse generation device 640 performs the switch control, and the switch pulses PLS20 to PLS23, . . . are generated in response to the control signal CTL11 given by an external register of the system control unit 340 and the like.

For example, the switch pulse LPS22 supplied to the bit shift switch SW22 is changed to the high level, and the other switch pulses PLS20, PLS21, PLS23, . . . are changed to the low level.

Accordingly, the bit shift switch SW22 turns on, and the other bit shift switches SW20, SW21, SW23, . . . turn off. The complementary switch /SW22 turns off, and the complementary switches /SW20, /SW21, /SW23, . . . turn on.

According to such switch control, the carry signal CRY goes into the D-type flip flop DFF22, and the counter operation can be achieved with two bits shifted to the upper side.

As described above, FIG. 24 is an example of switch control of two bits shift, and B[5], B[6] of the first signal are left stored in the D-type flip flops DFF20, DFF21 and no subtraction is performed. Therefore, like the lower bits G[0] to G[4] of the gray code, the CDS processing is performed (for example, this can be achieved by FIG. 16 in Patent Document 2).

<2.11 Fourth Configuration Example of Column Processing Unit>

Figure 25:
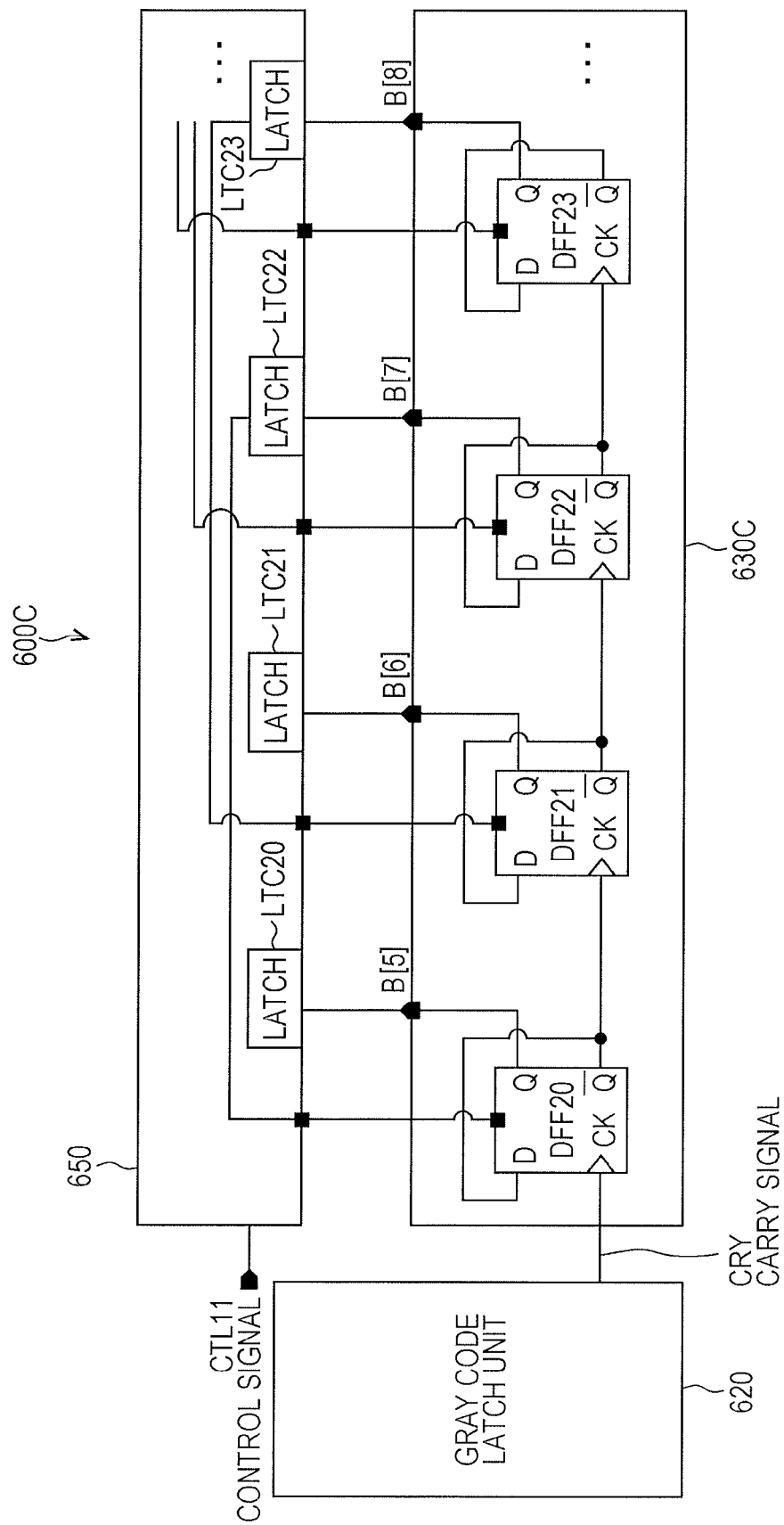
FIG. 25 is a figure illustrating a specific fourth configuration example of a gray code latch unit and a U/D counter (ripple counter) unit of the column processing unit of the second ADC according to the present embodiment.

FIG. 25 is a figure illustrating a specific fourth configuration example of a gray code latch unit and a U/D counter (ripple counter) unit of the column processing unit of the second ADC according to the present embodiment.

The column processing unit 600C of FIG. 25 is an example of shifting two bits to the lower side.

A bit shift circuit 650 is constituted by latches LTC20 to LTC23, . . . , and a multiplexer, not shown.

A U/D counter unit 630C of the column processing unit 600C of FIG. 25 has a configuration obtained by deleting the bit shift switches SW21 to SW23, . . . , complementary switches /SW20 to /SW23, . . . from the configuration of FIG. 24.

In the column processing unit 600C, each bit output of the first signal is temporarily stored in the latches LTC20 to LTC23, . . . in the bit shift circuit 650.

In accordance with desired bit shift with the control signal CTL11, the data stored in the latches LTC20 to LTC23, . . . are written to the D-type flip flop DFF of the lower side.

It should be noted that the data inversion operation may be performed within the D-type flip flop independently from the bit shift, or may be performed in parallel with the bit shift within the bit shift circuit 650.

This case is like the case of FIG. 24, and in this case, B[5], B[6] of the first signal are saved in the latches in the bit shift circuit 650 so that they are not affected by the up down counting, and the CDS processing is performed like the lower bits G[0] to G[4] of the gray code.

Four embodiments for performing the column CDS processing on the higher bits have been hereinabove explained as the first to fourth configuration examples of the column processing unit.

Subsequently, two embodiments for carrying out the column CDS processing on the gray code data of the lower bits will be explained as a fifth configuration example and a sixth configuration example of a column processing unit.

<2.12 Fifth Configuration Example of Column Processing Unit>

Figure 26:
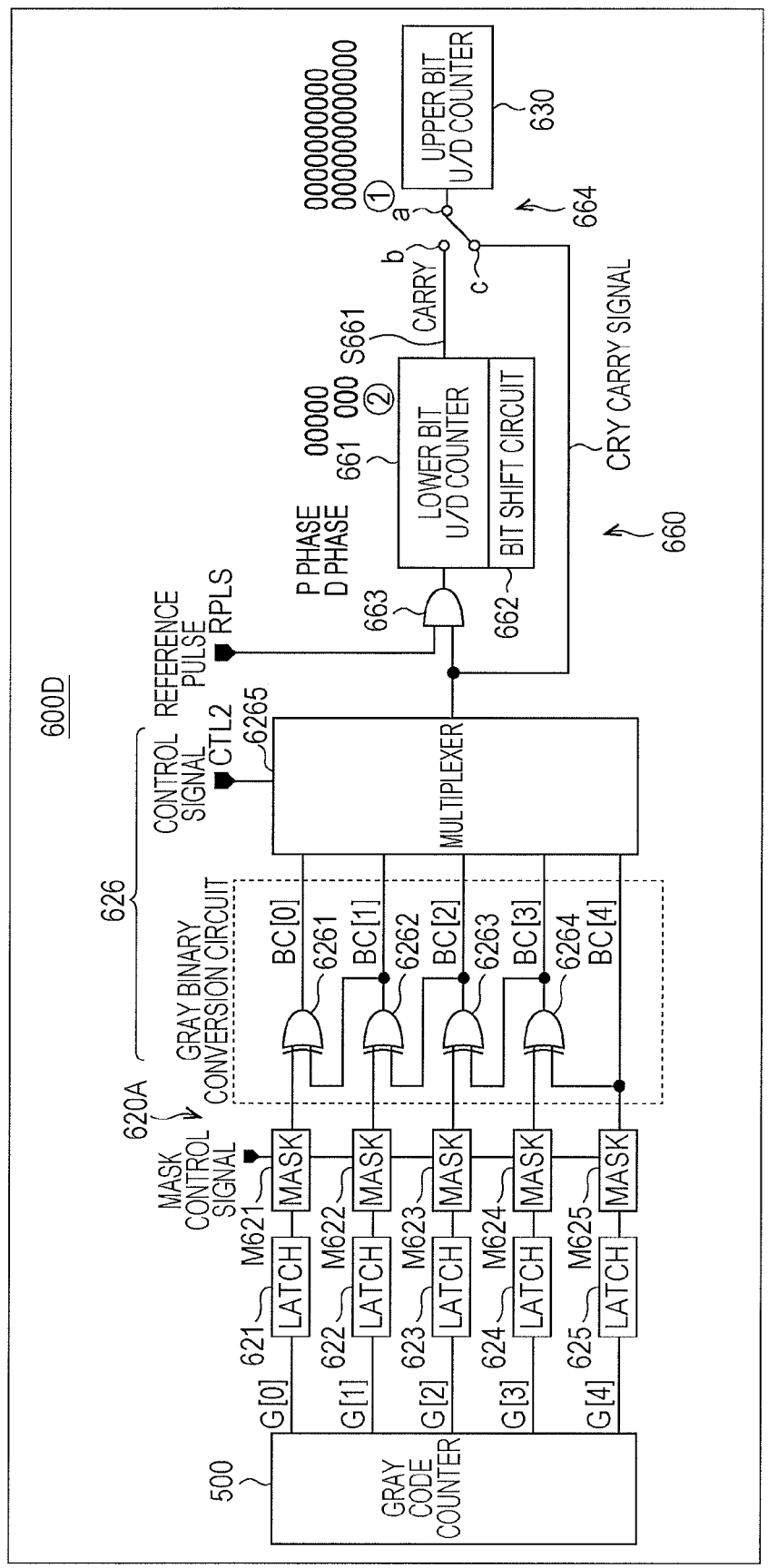
FIG. 26 is a figure illustrating a specific fifth configuration example of a gray code latch unit and a U/D counter (ripple counter) unit of the column processing unit of the second ADC according to the present embodiment.

FIG. 26 is a figure illustrating a specific fifth configuration example of a gray code latch unit and a U/D counter (ripple counter) unit of the column processing unit of the second ADC according to the present embodiment.

Figure 27:
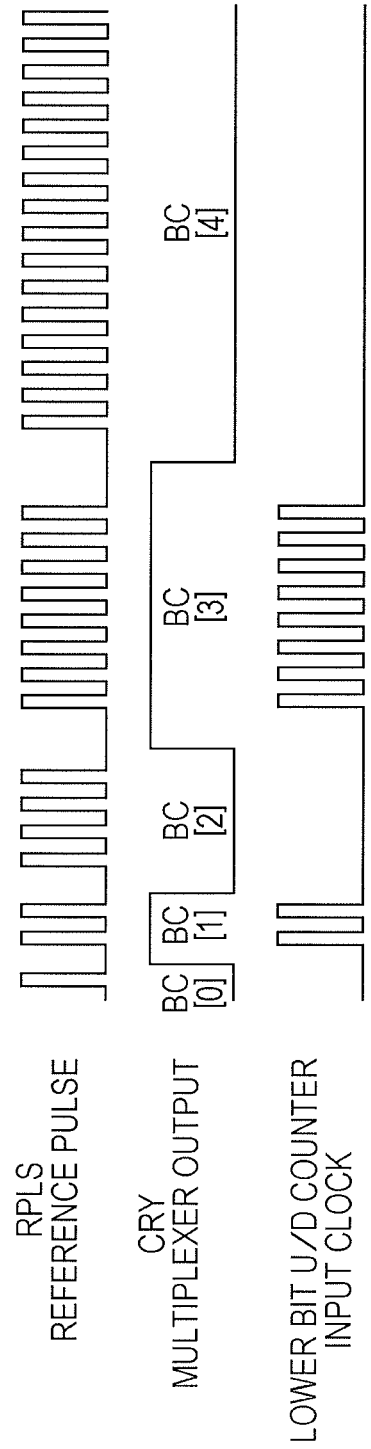
FIG. 27 is a timing chart mainly showing operation of the lower bit U/D counter unit of FIG. 26.

FIG. 27 is a timing chart mainly showing operation of the lower bit U/D counter unit of FIG. 26.

In the column processing unit 600D of FIG. 26, a lower bit U/D counter unit 660 is provided between the higher bit U/D counter unit 630 and the gray code latch unit 620A of the column processing unit 600A of FIG. 22.

The lower bit U/D counter unit 660 includes a lower bit U/D counter 661 and a bit shift circuit 662.

In the lower bit U/D counter unit 660, a two-input AND gate 663 is provided at the input side of the lower bit U/D counter 661, and a switch 664 is provided at the output side thereof.

One of the input terminals of the AND gate 663 is connected to the output line of the carry signal CRY of the gray code latch unit 620A, and the other of the input terminals of the AND gate 663 is connected to the supply line of the reference pulse RPLS.

The terminal a of the switch 664 is connected to the input of the higher bit U/D counter unit 630. The terminal b of the switch 664 is connected to the output line of a carry signal S661 of the lower bit U/D counter 661. The terminal c is connected to the output line of the carry signal CRY of the gray code latch unit 620A.

A gray binary conversion circuit is formed by the output stage of the mask circuit M625 and the EXORs 6261 to 6264 of the gray code latch unit 620A.

The carry signal generation circuit 626 performs conversion into a binary code and selects a code corresponding to the bit shift, and therefore it can be shared as the same circuit as the gray binary conversion circuit.

More specifically, the carry signal generation circuit and the gray binary conversion circuit can be shared by the same circuit.

Basically, this column processing unit 600D includes a lower bit U/D counter unit 660 within a column, and causes the lower bit U/D counter 661 to count the code converted from the gray code into the binary code, thus achieving the CDS of lower bits.

In this fifth configuration example, the higher bits achieve the bit shift CDS upon generation of the carry signal CRY bit-shifted.

The lower bits achieve the bit shift CDS by the bit shift circuit 662 in the lower bit U/D counter unit 660.

The column processing unit 600D of FIG. 26 shows an example where the second signal is obtained upon being shifted by two bits to the upper side.

In this example, for the higher bits, the carry signal CRY shifted by two bits is selected by the multiplexer (selector) 6265, and thus the bit shift CDS is achieved.

After the higher bit U/D counter unit 630 finishes counting, the lower bit U/D counter unit 660 is caused to count with the gray code data for the lower digits.

In the example of FIG. 26, the code converted from the gray code into the binary code is selected by the multiplexer 6265 so that B[0] is selected first and then B[2] is selected subsequently, and they are output.

When the binary code is at a high level, the lower bit U/D counter 661 performs counting. In this case, this is given to the third bit D-type flip flop (DFF) of the lower bit U/D counter 661, which means that it is shifted by two bits.

The lower bits are given to the D-type flip flop in which the reference pulse RPLS is shifted by two bits by the bit shift circuit 662, and thus two bits shifting is achieved.

<2.13 Sixth Configuration Example of Column Processing Unit>

Figure 28:
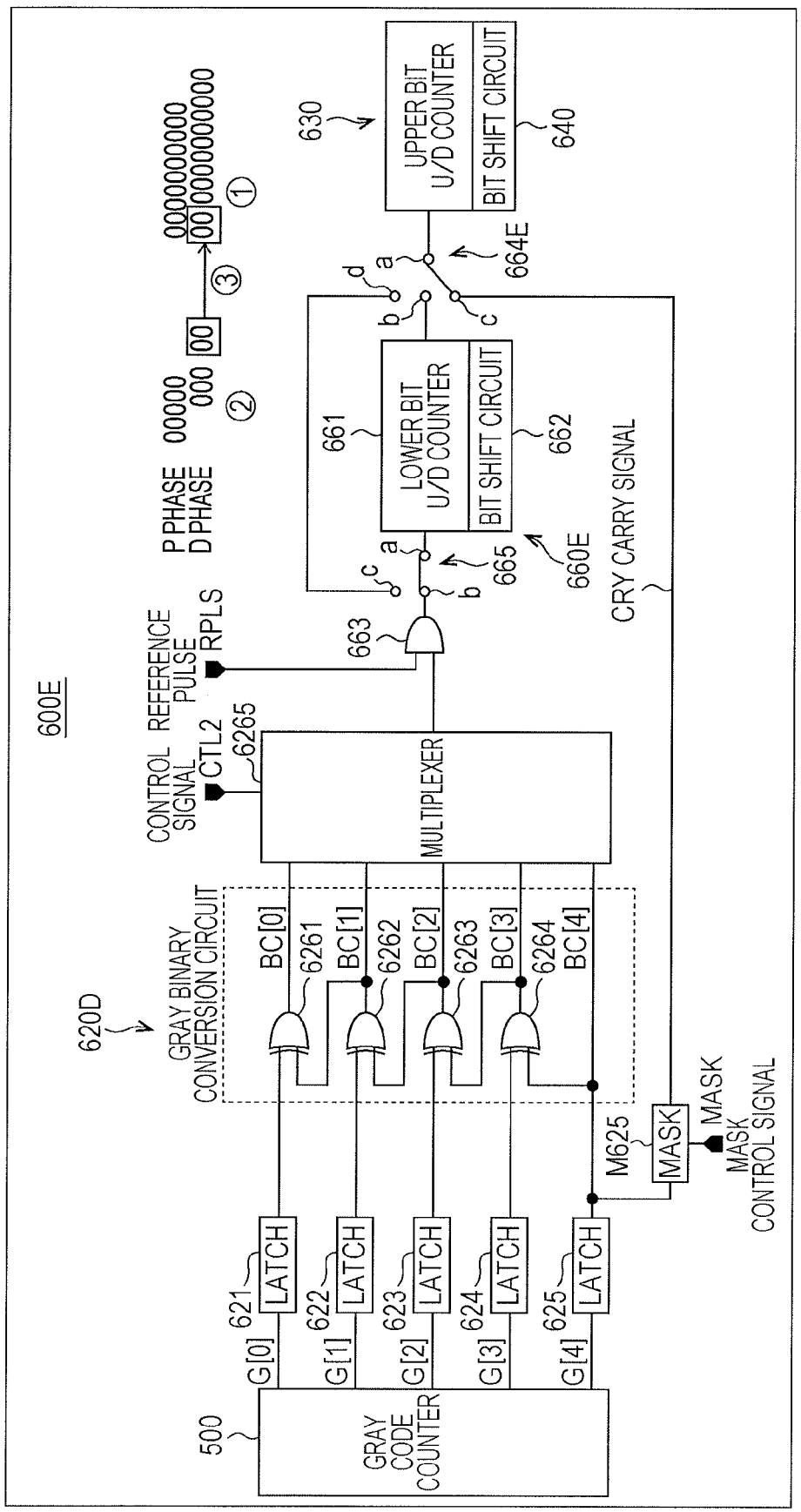
FIG. 28 is a figure illustrating a specific sixth configuration example of a gray code latch unit and a U/D counter (ripple counter) unit of the column processing unit of the second ADC according to the present embodiment.

FIG. 28 is a figure illustrating a specific sixth configuration example of a gray code latch unit and U/D counter (ripple counter) unit of the column processing unit of the second ADC according to the present embodiment.

Figure 29:
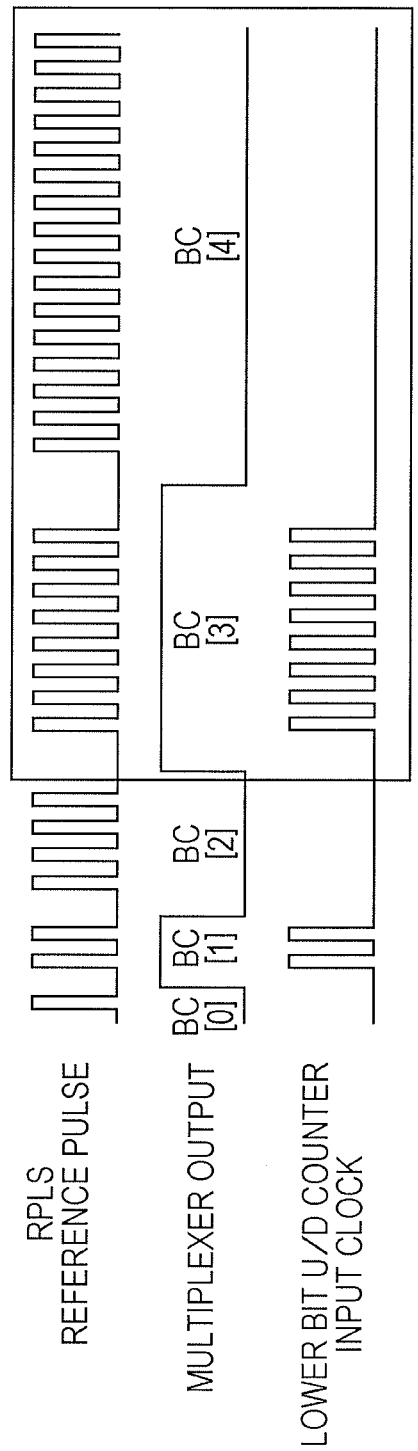
FIG. 29 is a timing chart mainly showing operation of the lower bit U/D counter unit of FIG. 28.

FIG. 29 is a timing chart mainly showing operation of the lower bit U/D counter unit of FIG. 28.

Figure 30:
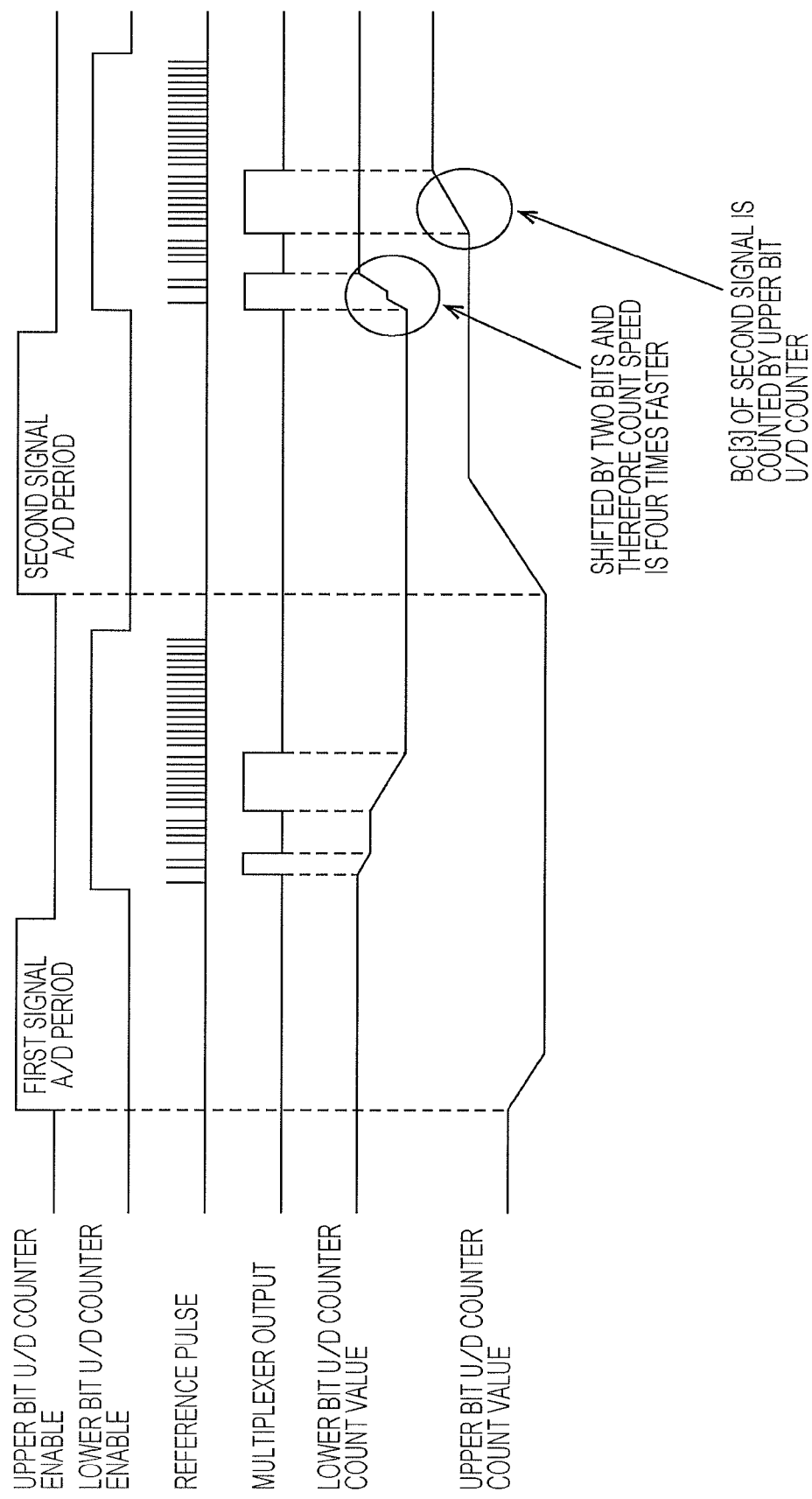
FIG. 30 is a timing chart of the entire circuit of FIG. 28.

FIG. 30 is a timing chart of the entire circuit of FIG. 28.

The column processing unit 600E of FIG. 28 is different from the column processing unit 600D of FIG. 26 in the following features.

In the column processing unit 600E of FIG. 28, the output of the multiplexer (selector) 6265 of the gray code latch unit 620E is input into only the AND gate 663 of the lower bit U/D counter unit 660.

In the column processing unit 600E, only the mask circuit M625 is provided.

In the column processing unit 600E, the gray code G[4] latched in the gray code latch 625 is input into the terminal c of the switch 664E at the input side of the higher bit U/D counter unit 630 using the signal having passed through the mask circuit M625 as the carry signal CRY.

A switch 665 is provided between the output of the AND gate 663 of the lower bit U/D counter unit 630E and the input terminal of the lower bit U/D counter 661.

The terminal a of the switch 665 is connected to the input terminal of the lower bit U/D counter 661. The terminal b of the switch 665 is connected to the output of the AND gate 663. The terminal c of the switch 665 is connected to the terminal d of a switch 664E.

In the column processing unit 600E of FIG. 28, the higher bits achieve the bit shift CDS in the bit shift circuit (for example, the circuit of FIG. 24) 640 in the higher bit U/D counter unit.

In the column processing unit 600E, the lower bits achieve the bit shift CDS in the bit shift circuit 662 in the lower bit U/D counter unit 660E.

The higher bits remaining as a result of the bit shift of the lower bit code are counted by the higher bit U/D counter unit 630.

The column processing unit 600E of FIG. 28 also shows an example where the second signal is obtained upon being shifted by two bits to the upper side.

In the column processing unit 600E, for the higher bits, the carry signal CRY shifted by two bits by the bit shift circuit is input into the D-type flip flop, and thus the two bit shift CDS is achieved.

For the lower bits, the reference pulse RPLS shifted by two bits by the bit shift circuit 662 is input into the D-type flip flop, and thus the two bit shift is achieved.

The count clock for the binary codes BC[3], BC[4] are provided to the D-type flip flop corresponding to the least significant bit at the higher bit U/D counter, and thus the two bit shift is achieved.

In this case, because of the two bit shift, the count speed is four times faster as shown in FIG. 30.

The BC[3] of the second signal is counted by the higher bit U/D counter unit 630.

In FIG. 30, down count and up count are shown. Alternatively, up count and up count may also be used.

The second column ADC according to this the present embodiment can obtain the same effects as those of the effects of the first column ADC explained above.

More specifically, according to this second column ADC, the counter digital CDS with different bit precisions can be done, and it is not necessary to obtain the first signal and the second signal with bit precisions, and therefore, the circuit can attain a higher speed.

The solid-state image-capturing device can obtain an image of a high dynamic range without degrading the frame rate.

The bit shift circuit may be a switch or a simple logic circuit, and therefore, as compared with multiple counters arranged for respective bit precisions and CDS processing performed in a downstream stage, the increase of the circuit size and the electric power consumption can be alleviated.

The mask period is provided for the gray code latch data, and therefore, this can ensure margin for avoiding bit inconsistency.

The solid-state image-capturing device (CMOS image sensor) serving as the semiconductor device explained above also employs the stacking structure of FIGS. 1, 5, and the like.

The solid-state image-capturing device having the configurations and effects explained above can be employed as an image-capturing device for an electronic device such as a portable device (a mobile device), a digital camera, and a video camera.

<3. Configuration Example of Electronic Device>

Figure 31:
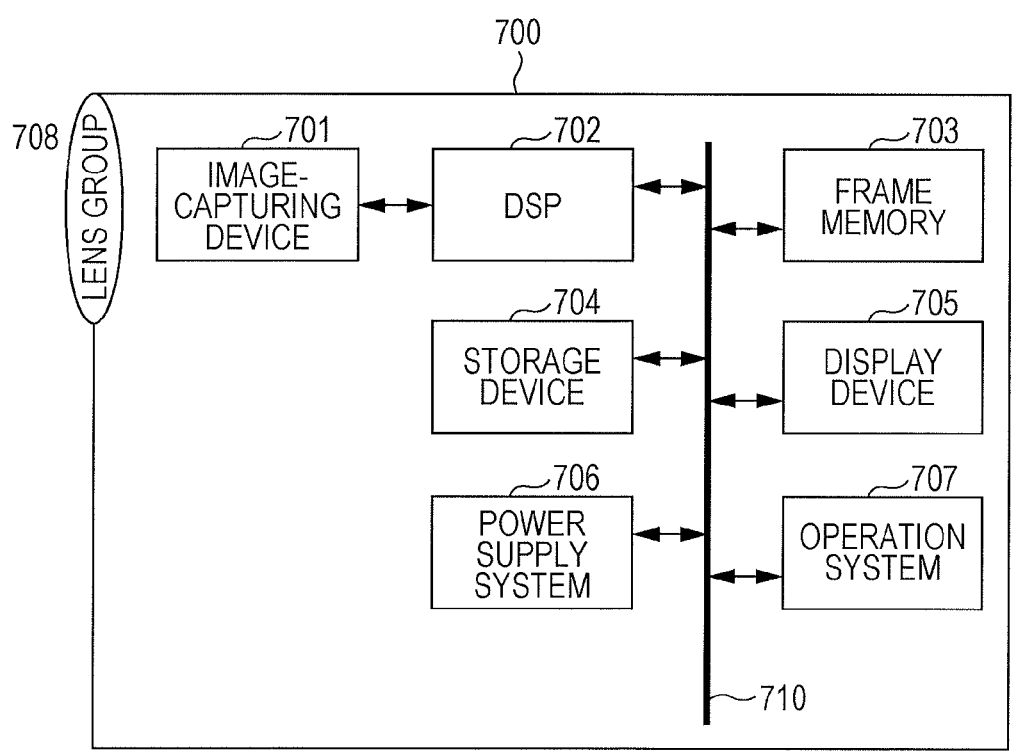
FIG. 31 is a figure illustrating an example of configuration of an electronic device to which the solid-state image-capturing device according to the present embodiment is applied.

FIG. 31 is a figure illustrating an example of configuration of an electronic device to which the solid-state image-capturing device according to the present embodiment is applied.

FIG. 31 illustrates a configuration example of, for example, an image-capturing device 700 which is an example of an electronic device according to the present embodiment.

The image-capturing device 700 includes an image-capturing device 701, a DSP 702 which is a signal processing unit, a frame memory 703, a recording device 704, a display device 705, a power supply system 706, and an operation system 707, which are connected with each other via a bus line 710.

An optical system 708 including a lens group for making a subject image on a light reception surface is provided at a light reception surface side of the image-capturing device 701.

The solid-state image-capturing device according to the present embodiment can be applied to the image-capturing device 701.

The image-capturing device 700 explained above is applied to a video camera, a digital still camera, and a camera module for mobile devices.

As described above, the solid-state image-capturing device explained above is provided as an image-capturing device 701 in an image-capturing device such as a digital still camera, so that high precision camera can be achieved.

It should be noted that the present technique may be configured as follows.

(1) An A/D conversion device including a reading unit having an analog digital (A/D) conversion unit configured to compare a level of a input analog signal with a reference signal that displaces with a configured slope and making the output signal into digital data on the basis of a period when the output signal and the reference signal attain a predetermined relationship, wherein the reading unit includes:

a comparator configured to compare the analog signal potential with the reference signal of which slope is variable;

a counter latch unit capable of AD conversion based on processing according to the output of the comparator; and a bit shift function unit capable of bit-shifting the digital data obtained by the counter latch unit, and wherein when digital Correlated Double Sampling (CDS) is performed with a first signal and a second signal having different bit precisions obtained from the comparison with reference signals of different slopes, the bit shift function unit bit-shifts the first signal or the second signal.

(2) The A/D conversion device according to (1), wherein when the digital CDS is performed, the reading unit obtains the first signal with a bit precision N1 and obtains the second signal with a bit precision N2, after the first signal is obtained, one's complement number is derived to invert storage data, and the second signal is shifted by |N1−N2| bits to the upper side and the inverted first signal is added to the bit-shifted second signal, so that the digital CDS is executed.

(3) The A/D conversion device according to (1), wherein when the digital CDS is performed, the reading unit obtains the first signal with a bit precision N1 and obtains the second signal with a bit precision N2, after the first signal is obtained, the first signal is shifted by |N1−N2| bits to the lower side, and one's complement number is derived to invert storage data, and the second signal is added to the bit-shifted first signal, so that the digital CDS is executed.

(4) The A/D conversion device according to (1) or (2), wherein a bit precision of the first signal is N1, and a bit precision of the second signal is N2, the counter unit is formed by a binary ripple counter including a plurality of flip flops in which clock input terminals receiving the reference clock are cascade-connected, and the bit shift function unit inputs the reference clock, which is received by a flip flop of a least significant bit when the first signal is obtained, into a flip flop of a bit higher by |N1−N2| bits when the second signal is obtained, so that the weights of the bits of the signals are caused to be the same, and thus, the digital CDS is executed in the counter.

(5) The A/D conversion device according to (1) or (3), wherein a bit precision of the first signal is N1, and a bit precision of the second signal is N2, the counter unit is formed by a binary ripple counter including a plurality of flip flops in which clock input terminals receiving the reference clock are cascade-connected, and the bit shift function unit saves storage data of the first signal, bit-shifts the saved data by |N1−N2| bits to the lower side and writes the data to a latch in the ripple counter, and reads the second signal, and thus, the digital CDS is executed in the counter.

(6) The A/D conversion device according to (1), wherein the counter latch unit includes a code counter configured to generate a digital code in response to the reference clock;

a lower bit code latch unit configured to, upon a trigger of inversion of an output signal of the comparator, latch the digital code generated by the code counter in response to the output signal of the comparator inverted; and a higher bit counter unit configured to count the data of the lower bit latch unit as a carry signal, and the lower bit code latch unit includes a latch configured to latch each bit code of the code counter; and a carry signal generation unit configured to generate a carry signal that is bit-shifted by logic synthesis of data of each bit latched in the latch, and functions as the bit shift function unit.

(7) The A/D conversion device according to (6), wherein when the digital CDS is performed, the reading unit obtains the first signal with a bit precision N1 and obtains the second signal with a bit precision N2, and the carry signal generation unit generates the carry signal that is shifted by |N1−N2| bits.

(8) The A/D conversion device according to (6) or (7), wherein a bit precision of the first signal is N1, and a bit precision of the second signal is N2, the higher bit counter unit is formed by a binary ripple counter including a plurality of flip flops in which clock input terminals receiving the carry signal as the reference clock are cascade-connected, the higher bit counter unit inputs the reference clock, which is received by a flip flop of a least significant bit when the first signal is obtained, into a flip flop of a bit higher by |N1−N2| bits when the second signal is obtained, so that the weights of the bits of the signals are caused to be the same, and thus, the digital CDS is executed in the counter.

(9) The A/D conversion device according to (6) or (7), wherein a bit precision of the first signal is N1, and a bit precision of the second signal is N2, the higher bit counter unit is formed by a binary ripple counter including a plurality of flip flops in which clock input terminals receiving the carry signal as the reference clock are cascade-connected, the higher bit counter unit saves storage data of the first signal, bit-shifts the saved data by |N1−N2| bits to the lower side and writes the data to a latch in the ripple counter, and reads the second signal, and thus, the digital CDS is executed in the counter.

(10) The A/D conversion device according to any one of (6) to (9), wherein the counter latch unit includes a mask circuit for ensuring a mask period for a carry signal made into a higher frequency in accordance with a mask signal for latch data of the latch.

(11) The A/D conversion device according to any one of (6) to (10) including a lower bit counter unit provided between an output of the lower bit code latch unit and the higher bit counter unit, and the lower bit counter unit including the bit shift function and executing the digital CDS of a lower bit upon selectively receiving lower bit data of the lower bit code latch unit.

(12) A solid-state image-capturing device including:
a photoelectric conversion device;
a pixel circuit configured to output, to a signal line, an analog signal corresponding to electrical charge photoelectrically converted by the photoelectric conversion device; and
a reading unit having an analog digital (A/D) conversion unit configured to compare an output level of the signal line with a reference signal that displaces with a configured slope and making the output signal into digital data on the basis of a period when the output signal and the reference signal attain a predetermined relationship,
wherein the reading unit includes:
a comparator configured to compare the analog signal potential of the signal line with the reference signal of which slope is variable;
a counter latch unit capable of AD conversion based on processing according to the output of the comparator; and
a bit shift function unit capable of bit-shifting the digital data obtained by the counter latch unit, and
wherein when digital Correlated Double Sampling (CDS) is performed with a first signal and a second signal which are read from the pixel circuit and having different bit precisions obtained from the comparison with reference signals of different slopes, the bit shift function unit bit-shifts the first signal or the second signal.

(13) The solid-state image-capturing device according to (12), wherein when the digital CDS is performed, the reading unit obtains the first signal with a bit precision N1 and obtains the second signal with a bit precision N2, after the first signal is obtained, one's complement number is derived to invert storage data, and the second signal is shifted by |N1−N2| bits to the upper side and the inverted first signal is added to the bit-shifted second signal, so that the digital CDS is executed.

(14) The solid-state image-capturing device according to (12), wherein when the digital CDS is performed, the reading unit obtains the first signal with a bit precision N1 and obtains the second signal with a bit precision N2, after the first signal is obtained, the first signal is shifted by |N1−N2| bits to the lower side, and one's complement number is derived to invert storage data, and the second signal is added to the bit-shifted first signal, so that the digital CDS is executed.

(15) The solid-state image-capturing device according to (12) or (13), wherein a bit precision of the first signal is N1, and a bit precision of the second signal is N2, the counter unit is formed by a binary ripple counter including a plurality of flip flops in which clock input terminals receiving the reference clock are cascade-connected, and the bit shift function unit inputs the reference clock, which is received by a flip flop of a least significant bit when the first signal is obtained, into a flip flop of a bit higher by |N1−N2| bits when the second signal is obtained, so that the weights of the bits of the signals are caused to be the same, and thus, the digital CDS is executed in the counter.

(16) The solid-state image-capturing device according to (12) or (14), wherein a bit precision of the first signal is N1, and a bit precision of the second signal is N2, the counter unit is formed by a binary ripple counter including a plurality of flip flops in which clock input terminals receiving the reference clock are cascade-connected, and the bit shift function unit saves storage data of the first signal, bit-shifts the saved data by |N1−N2| bits to the lower side and writes the data to a latch in the ripple counter, and reads the second signal, and thus, the digital CDS is executed in the counter.

(17) The solid-state image-capturing device according to (12), wherein the counter latch unit includes a code counter configured to generate a digital code in response to the reference clock;

a lower bit code latch unit configured to, upon a trigger of inversion of an output signal of the comparator, latch the digital code generated by the code counter in response to the output signal of the comparator inverted; and a higher bit counter unit configured to count the data of the lower bit latch unit as a carry signal, and the lower bit code latch unit includes a latch configured to latch each bit code of the code counter; and a carry signal generation unit configured to generate a carry signal that is bit-shifted by logic synthesis of data of each bit latched in the latch, and functions as the bit shift function unit.

(18) An electronic device including a solid-state image-capturing device, the solid-state image-capturing device including:

a photoelectric conversion device;

a pixel circuit configured to output, to a signal line, an analog signal corresponding to electrical charge photoelectrically converted by the photoelectric conversion device; and a reading unit having an analog digital (A/D) conversion unit configured to compare an output level of the signal line with a reference signal that displaces with a configured slope and making the output signal into digital data on the basis of a period when the output signal and the reference signal attain a predetermined relationship, wherein the reading unit includes:

a comparator configured to compare the analog signal potential of the signal line with the reference signal of which slope is variable;

a counter latch unit capable of AD conversion based on processing according to the output of the comparator; and a bit shift function unit capable of bit-shifting the digital data obtained by the counter latch unit, and wherein when digital Correlated Double Sampling (CDS) is performed with a first signal and a second signal which are read from the pixel circuit and having different bit precisions obtained from the comparison with reference signals of different slopes, the bit shift function unit bit-shifts the first signal or the second signal.

REFERENCE SIGNS LIST 100, 100A to 100G Semiconductor device
110, 110A to 110G First chip (analog chip)
111 (−0, −1, ...) Sensor
112 (−0, −1, ...) Sample and hold (SH) circuit
113 (−0, −1, ...) Amplifier
114 (−0, −1, ...) TCV (via)
115 (−0, −1, ...) Sampling switch
120, 120A to 120G Second chip (logic chip digital chip)
121 (−0, −1, ...) Sampling switch
122 (−0, −1, ...) Quantization device
123 Signal processing circuit
124 (−0, −1, ...) Comparator
125 (−0, −1, ...) Counter
200 Solid-state image-capturing device
210 Pixel unit
220 Row scanning unit
230 Column scanning unit
240 System control unit
250 Column signal processing unit
300 Solid-state image-capturing device
310 Pixel unit
320 Row scanning unit
330 Column scanning unit
340 System control unit
350 Column ADC
360 DAC (ramp signal generation device)
370 Amplifier circuit (S/A)
380 Signal processing unit
400, 400A Counter and bit shift system
410 Binary ripple counter
420 Bit shift circuit
500 Gray code counter
600, 600A to 600E Column processing unit
610 Comparator
620, 620A Lower bit gray code latch unit (lower bit latch unit)
630, 630B, 630C Higher bit U/D counter unit (higher bit counter unit) (U/B counter unit)
640 Bit shift switch pulse generation device
650 Bit shift circuit
700 Electronic device (image-capturing device)

The invention claimed is:

1. An A/D conversion device comprising:
a reading unit that is configured to include analog digital (A/D) conversion that compares a level of an input analog signal with reference signals that respectively have different slopes and that is configured to make an output signal into digital data on the basis of a period when the input analog signal and a respective one of the reference signals attain a predetermined relationship,
wherein the reading unit includes:
a comparator configured to compare the input analog signal with the reference signals to provide comparator output;
counter latch circuitry configured for AD conversion based on the comparator output to provide the digital data; and
bit shift circuitry configured to bit-shift the digital data, and
wherein when digital Correlated Double Sampling (CDS) is performed with a first signal and a second signal having different bit precisions obtained from the comparison with the reference signals respectively having different slopes, the bit shift circuitry bit-shifts the first signal or the second signal.

2. The A/D conversion device according to according to claim 1, wherein when the digital CDS is performed, the reading unit obtains the first signal with a bit precision N1 and obtains the second signal with a bit precision N2,
after the first signal is obtained, one's complement number is derived to invert the first signal, and
the second signal is shifted by |N1−N2| bits to the upper side and the inverted first signal is added to the bit-shifted second signal, so that the digital CDS is executed.

3. The A/D conversion device according to claim 1, wherein when the digital CDS is performed, the reading unit obtains the first signal with a bit precision N1 and obtains the second signal with a bit precision N2,
after the first signal is obtained, the first signal is shifted by |N1−N2| bits to the lower side, and one's complement number is derived to invert storage data, and
the second signal is added to the bit-shifted first signal, so that the digital CDS is executed.

4. The A/D conversion device according to claim 1, wherein a bit precision of the first signal is N1, and a bit precision of the second signal is N2, the counter latch circuitry comprises a binary ripple counter including a plurality of flip flops in which clock input terminals receiving the reference clock are cascade-connected, the bit shift circuitry inputs the reference clock, which is received by a flip flop of a least significant bit when the first signal is obtained, into a flip flop of a bit higher by |N1−N2| bits when the second signal is obtained, so that the weights of the bits of the signals are caused to be the same, and thus, the digital CDS is executed in the counter.

5. The A/D conversion device according to claim 1, wherein a bit precision of the first signal is N1, and a bit precision of the second signal is N2, the counter latch circuitry comprises a binary ripple counter including a plurality of flip flops in which clock input terminals receiving the reference clock are cascade-connected, and the bit shift circuitry saves storage data of the first signal, bit-shifts the saved data by |N1−N2| bits to the lower side and writes the data to a latch in the ripple counter, and reads the second signal, and thus, the digital CDS is executed in the counter.

6. The A/D conversion device according to claim 1, wherein the counter latch circuitry includes a code counter configured to generate a digital code in response to the reference clock;

a lower bit code latch unit configured to, upon a trigger of inversion of an output signal of the comparator, latch the digital code generated by the code counter in response to the output signal of the comparator inverted; and a higher bit counter unit configured to count the data of the lower bit latch unit as a carry signal, and the lower bit code latch unit includes a latch configured to latch each bit code of the code counter; and a carry signal generation unit configured to generate a carry signal that is bit-shifted by logic synthesis of data of each bit latched in the latch, and functions as the bit shift function unit.

7. The A/D conversion device according to claim 6, wherein when the digital CDS is performed, the reading unit obtains the first signal with a bit precision N1 and obtains the second signal with a bit precision N2, and the carry signal generation unit generates the carry signal that is shifted by |N1−N1| bits.

8. The A/D conversion device according to claim 6, wherein a bit precision of the first signal is N1, and a bit precision of the second signal is N2, the higher bit counter unit is formed by a binary ripple counter including a plurality of flip flops in which clock input terminals receiving the carry signal as the reference clock are cascade-connected, the higher bit counter unit inputs the reference clock, which is received by a flip flop of a least significant bit when the first signal is obtained, into a flip flop of a bit higher by |N1−N2| bits when the second signal is obtained, so that the weights of the bits of the signals are caused to be the same, and thus, the digital CDS is executed in the counter.

9. The A/D conversion device according to claim 6, wherein a bit precision of the first signal is N1, and a bit precision of the second signal is N2, the higher bit counter unit is formed by a binary ripple counter including a plurality of flip flops in which clock input terminals receiving the carry signal as the reference clock are cascade-connected, the higher bit counter unit saves storage data of the first signal, bit-shifts the saved data by |N1−N2| bits to the lower side and writes the data to a latch in the ripple counter, and reads the second signal, and thus, the digital CDS is executed in the counter.

10. The A/D conversion device according to claim 6, wherein the counter latch circuitry includes a mask circuit for ensuring a mask period for a carry signal made into a higher frequency in accordance with a mask signal for latch data of the latch.

11. The A/D conversion device according to claim 6, further comprising a lower bit counter unit provided between an output of the lower bit code latch unit and the higher bit counter unit, the lower bit counter unit including the bit shift function and executing the digital CDS of a lower bit upon selectively receiving lower bit data of the lower bit code latch unit.

12. A solid-state image-capturing device comprising:

a photoelectric conversion device;

a pixel circuit configured to output, to a signal line, an analog signal corresponding to electrical charge photoelectrically converted by the photoelectric conversion device; and a reading unit that is configured to include analog digital (A/D) conversion that compares a level of the analog signal on the signal line with reference signals that respectively have different slopes and that is configured to make an output signal into digital data on the basis of a period when the level of the analog signal on the signal line and a respective one of the reference signals attain a predetermined relationship, wherein the reading unit includes:

a comparator configured to compare the analog signal on the signal line with the reference signals to provide comparator output;

counter latch circuitry configured for AD conversion based on the comparator output to provide the digital data; and bit shift configured to bit-shift the digital data, and wherein when digital Correlated Double Sampling (CDS) is performed with a first signal and a second signal which are read from the pixel circuit and having different bit precisions obtained from the comparison with reference signals respectively having different slopes, the bit shift circuitry bit-shifts the first signal or the second signal.

13. The solid-state image-capturing device according to claim 12, wherein when the digital CDS is performed, the reading unit obtains the first signal with a bit precision N1 and obtains the second signal with a bit precision N2, after the first signal is obtained, one's complement number is derived to invert the first signal, and the second signal is shifted by |N1−N2| bits to the upper side and the inverted first signal is added to the bit-shifted second signal, so that the digital CDS is executed.

14. The solid-state image-capturing device according to claim 12, wherein when the digital CDS is performed, the reading unit obtains the first signal with a bit precision N1 and obtains the second signal with a bit precision N2, after the first signal is obtained, the first signal is shifted by |N1−N2| bits to the lower side, and one's complement number is derived to invert storage data, and the second signal is added to the bit-shifted first signal, so that the digital CDS is executed.

15. The solid-state image-capturing device according to claim 12, wherein a bit precision of the first signal is N1, and a bit precision of the second signal is N2, the counter latch circuitry comprises a binary ripple counter including a plurality of flip flops in which clock input terminals receiving the reference clock are cascade-connected, and the bit shift circuitry inputs the reference clock, which is received by a flip flop of a least significant bit when the first signal is obtained, into a flip flop of a bit higher by

|N1−N2| bits when the second signal is obtained, so that the weights of the bits of the signals are caused to be the same, and thus, the digital CDS is executed in the counter.

16. The solid-state image-capturing device according to claim 12, wherein a bit precision of the first signal is N1, and a bit precision of the second signal is N2,
the counter latch circuitry comprises a binary ripple counter including a plurality of flip flops in which clock input terminals receiving the reference clock are cascade-connected, and
the bit shift circuitry saves storage data of the first signal, bit-shifts the saved data by |N1−N2| bits to the lower side and writes the data to a latch in the ripple counter, and reads the second signal, and thus, the digital CDS is executed in the counter.

17. The solid-state image-capturing device according to claim 12, wherein the counter latch circuitry includes a code counter configured to generate a digital code in response to the reference clock;
a lower bit code latch unit configured to, upon a trigger of inversion of an output signal of the comparator, latch the digital code generated by the code counter in response to the output signal of the comparator inverted; and
a higher bit counter unit configured to count the data of the lower bit latch unit as a carry signal, and
the lower bit code latch unit includes
a latch configured to latch each bit code of the code counter; and
a carry signal generation unit configured to generate a carry signal that is bit-shifted by logic synthesis of data of each bit latched in the latch, and functions as the bit shift function unit.

18. An electronic device comprising a solid-state image-capturing device,
the solid-state image-capturing device comprising:
a photoelectric conversion device;
a pixel circuit configured to output, to a signal line, an analog signal corresponding to electrical charge photoelectrically converted by the photoelectric conversion device; and
a reading unit that is configured to include analog digital (A/D) conversion that compares a level of the analog signal on the signal line with reference signals that respectively have different slopes and that is configured to make an output signal into digital data on the basis of a period when the level of the analog signal on the signal line and a respective one of the reference signals attain a predetermined relationship,
wherein the reading unit includes:
a comparator configured to compare the analog signal on the signal line with the reference signals to provide comparator output;
counter latch circuitry configured for AD conversion based on the comparator output to provide the digital data; and
bit shift circuitry configured to bit-shift the digital data, and
wherein when digital Correlated Double Sampling (CDS) is performed with a first signal and a second signal which are read from the pixel circuit and having different bit precisions obtained from the comparison with reference signals respectively having different slopes, the bit shift circuitry bit-shifts the first signal or the second signal.

19. The electronic device according to claim 18, wherein when the digital CDS is performed, the reading unit obtains the first signal with a bit precision N1 and obtains the second signal with a bit precision N2,
after the first signal is obtained, one's complement number is derived to invert the first signal, and
the second signal is shifted by |N1−N2| bits to the upper side and the inverted first signal is added to the bit-shifted second signal, so that the digital CDS is executed.

20. The electronic device according to claim 18, wherein when the digital CDS is performed, the reading unit obtains the first signal with a bit precision N1 and obtains the second signal with a bit precision N2,
after the first signal is obtained, the first signal is shifted by |N1−N2| bits to the lower side, and one's complement number is derived to invert storage data, and
the second signal is added to the bit-shifted first signal, so that the digital CDS is executed.

* * * * *